United States Patent
Kuwahara et al.

(10) Patent No.: US 8,982,437 B2
(45) Date of Patent: Mar. 17, 2015

(54) HOLOGRAM RECORDING FILM AND METHOD OF MANUFACTURING SAME, AND IMAGE DISPLAY APPARATUS

(75) Inventors: Mieko Kuwahara, Kanagawa (JP); Takuji Yoshida, Kanagawa (JP); Katsuyuki Akutsu, Kanagawa (JP)

(73) Assignee: Sony Corporation, Tokyo (JP)

(*) Notice: Subject to any disclaimer, the term of this patent is extended or adjusted under 35 U.S.C. 154(b) by 328 days.

(21) Appl. No.: 12/633,475

(22) Filed: Dec. 8, 2009

(65) Prior Publication Data

US 2010/0142015 A1   Jun. 10, 2010

(30) Foreign Application Priority Data

Dec. 9, 2008   (JP) .................. 2008-312837

(51) Int. Cl.
*G03H 1/02*   (2006.01)
*G03H 1/04*   (2006.01)
(Continued)

(52) U.S. Cl.
CPC .............. *G03H 1/0272* (2013.01); *G02B 5/32* (2013.01); *G02B 27/0103* (2013.01); *G03F 7/001* (2013.01); *G03H 1/04* (2013.01); *G03H 1/0408* (2013.01); *G02B 2027/0109* (2013.01);
(Continued)

(58) Field of Classification Search
CPC ......... G03H 1/0252; G03H 1/28; G03H 1/20; G03H 2001/185
USPC ........ 359/15, 16, 32, 34, 569, 576, 3; 385/31; 430/1, 2
See application file for complete search history.

(56) References Cited

U.S. PATENT DOCUMENTS 5,282,066 A * 1/1994 Yu et al. .............................. 359/3
7,418,170 B2 * 8/2008 Mukawa et al. ................ 385/31
(Continued)

FOREIGN PATENT DOCUMENTS

JP   05-273900   10/1993
JP   07-149088   6/1995
(Continued)

OTHER PUBLICATIONS

"Temperature-induced changes in photopolymer volumn holograms" by Dhar et al, Applied Physics Letters, vol. 73, No. 10, pp. 1337 to 1339.*

(Continued)

*Primary Examiner* — Audrey Y Chang
(74) *Attorney, Agent, or Firm* — K&L Gates LLP

(57) ABSTRACT

A hologram recording film manufacturing method includes the steps of obtaining a laminated structure by alternately laminating M (where M≥2) photosensitive material precursor layers including a photosensitive material and at least one (M−1) resin layer on one another, obtaining M photosensitive material layers, where at least two interference fringes with a desired pitch and a desired slant angle are formed on each of the M photosensitive material layers, from the M photosensitive material precursor layers by irradiating the laminated structure with a reference laser light beam and an object laser light beam, and making the slant angles of the M photosensitive material layers different from each other while retaining the pitch value, which is defined on a face of the photosensitive material layer, by irradiating the laminated structure with an energy ray from the laminated structure's one face side, and heating the laminated structure.

7 Claims, 17 Drawing Sheets

(51) Int. Cl.
*G02B 5/32* (2006.01)
*G02B 27/01* (2006.01)
*G03F 7/00* (2006.01)
*G03H 1/26* (2006.01)

(52) U.S. Cl.
CPC ...... *G03H1/0248* (2013.01); *G03H 2001/0439* (2013.01); *G03H 2001/2615* (2013.01); *G03H 2001/263* (2013.01); *G03H 2222/18* (2013.01); *G03H 2001/026* (2013.01)
USPC .......... 359/3; 359/24; 359/576; 430/1; 430/2

(56) References Cited

U.S. PATENT DOCUMENTS

| | | | |
|---|---|---|---|
| 7,453,612 B2* | 11/2008 | Mukawa | 359/15 |
| 7,542,185 B2* | 6/2009 | Tsukagoshi et al. | 359/3 |
| 7,579,119 B2* | 8/2009 | Ueda et al. | 430/1 |
| 2007/0252918 A1* | 11/2007 | Furuya et al. | 348/742 |

FOREIGN PATENT DOCUMENTS

| | | |
|---|---|---|
| JP | 09-005526 | 1/1997 |
| JP | 11-174232 | 7/1999 |
| JP | 11-224061 | 8/1999 |
| JP | 2000-214747 | 8/2000 |
| JP | 2002-297004 | 10/2002 |
| JP | 2006-350129 | 12/2006 |
| JP | 2007-11057 | 1/2007 |
| WO | 2005-093493 | 10/2005 |

OTHER PUBLICATIONS

Japanese Office Action dated Apr. 5, 2011 for corresponding Japanese Application No. 2008-312837.

Japanese Office Action issued Jan. 29, 2013 in corresponding Japanese Patent Application No. 2011-110285, No English translation.

* cited by examiner

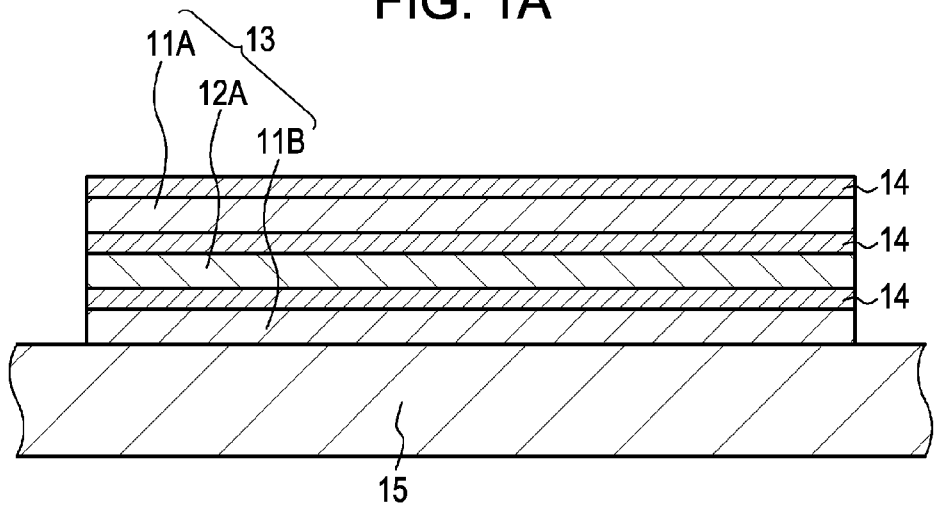
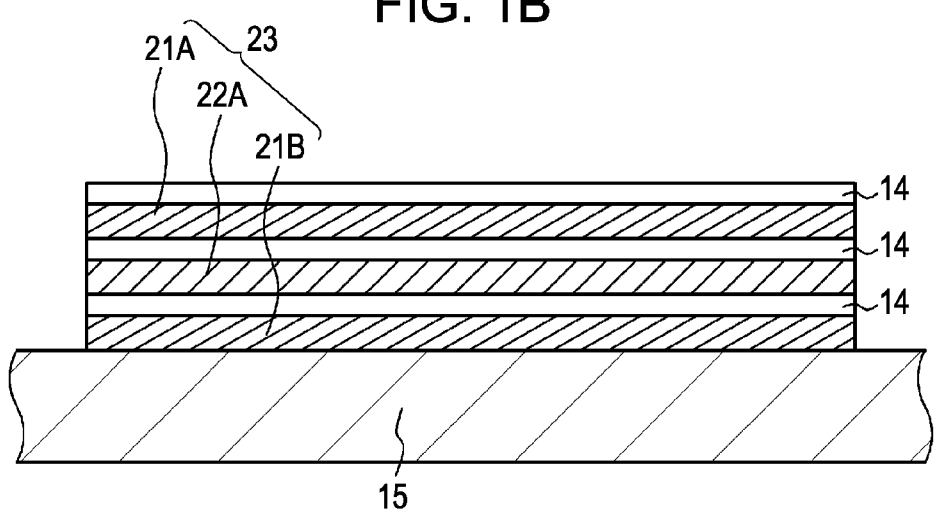
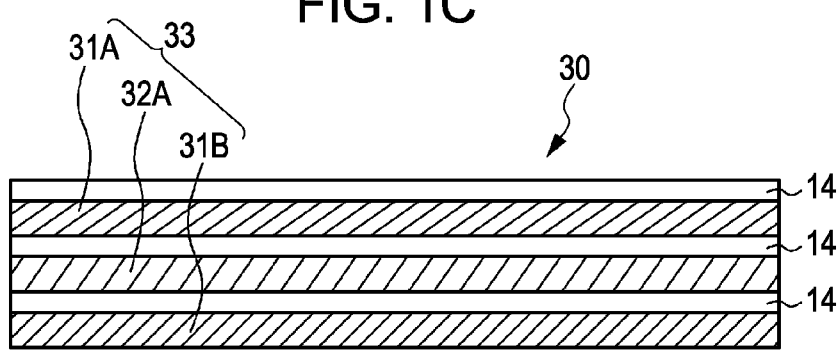

HOLOGRAM RECORDING FILM AND METHOD OF MANUFACTURING SAME, AND IMAGE DISPLAY APPARATUS

CROSS REFERENCES TO RELATED APPLICATIONS

The present application claims priority to Japanese Priority Patent Application JP 2008-312837 filed in the Japan Patent Office on Dec. 9, 2008, the entire content of which is hereby incorporated by reference.

BACKGROUND

The present application relates to a hologram recording film and a method of manufacturing same, and an image display apparatus.

Virtual image display devices (image display devices) using a hologram diffraction grating so as to allow an observer to observe a two-dimensional image generated through an image forming device as an enlarged virtual image through a virtual image optical system have been made public through, for example, Japanese Unexamined Patent Application Publication No. 2007-11057.

The above-described image display device, that is, an image display device 100 includes, for example, an image forming device 111 configured to form and display an image, a collimating optical system 112, and a virtual image optical system (optical device 120) onto which a light beam emitted from the image forming device 111 is made incident and by which the light beam is led to eyes 60 of the observer. Here, the optical device 120 includes a light guide plate 121, and first and second diffraction grating members 130 and 140 that are provided on the light guide plate 121. A light beam emitted from each of pixels of the image forming device 111 is made incident on the collimating optical system 112, and the collimating optical system 112 generates a plurality of collimated light beams that are made incident on the light guide plate 121 at angles different from each other, and the collimated light beams are made incident on the light guide plate 121. The collimated lights are made incident and emitted from one optical face (first face) 122 of the light guide plate 121. Further, the first and second diffraction grating members 130 and 140 are secured to the other optical face (second face) 123 of the light guide plate 121, the optical face 123 being parallel with the first face 122.

The collimated light beams that are made incident on the light guide plate 121 at the different angles from the first face 122 are made incident on the first diffraction grating member 130, and each of the collimated light beams is diffracted and reflected, as it is. Then, the diffracted and reflected collimated light beam travels while being totally reflected repetitively between the first and second faces 122 and 123, and is made incident on the second diffraction grating member 140. The collimated light beam which is made incident on the second diffraction grating member 140 does not satisfy the total reflection condition by being diffracted and reflected, and is emitted from the light guide plate 121 and led to the eyes 60 of the observer.

Each of the first and second diffraction grating members 130 and 140 includes a reflection-type volume hologram diffraction grating in which interference fringes are formed. Each of the first and second diffraction grating members 130 and 140 should be provided with a wide diffraction wavelength band. Namely, three primary-color light beams including a red light beam, a green light beam, and a blue light beam that are emitted from the image forming device 111 should be diffracted and reflected. Consequently, the interference fringes formed in the reflection-type volume hologram diffraction grating are duplexed. Otherwise, multiple diffraction grating layers are provided.

Here, a Bragg condition for attaining diffraction and reflection in the diffraction grating member is expressed through Equation (A) that follows. In Equation (A), the sign m denotes a positive integer, the sign $\lambda$ denotes a wavelength, the sign d denotes a pitch defined on a grating surface (which denotes an interval defined in the direction of the normal of a virtual plane including the interference fringes, and is hereinafter referred to as a "grating surface pitch"), and the sign $\Theta$ denotes the complementary angle of an angle at which a light beam is made incident on the interference fringe. The slant angle (inclination angle) $\phi$ of the interference fringes denotes an angle which the surface of the diffraction grating member forms with the interference fringe. The interference fringes are formed so as to extend from the inside the diffraction grating member to the surface of the diffraction grating member, as is the case with the following descriptions. Further, the relationships between the complementary angle $\Theta$, the slant angle $\phi$, and an incident angle $\psi$ that are obtained when a light beam enters the diffraction grating member at the incident angle $\psi$ are as shown in Equation (B), and illustrated in FIG. 10B. Further, the pitch $\Lambda$ of the interference fringes observed on the surface of the diffraction grating member is as shown in Equation (C). Hereinafter, the above-described pitch $\Lambda$ will be referred to as a "surface pitch" so as to be distinguished from the grating surface pitch d. The surface pitch $\Lambda$ is illustrated in FIG. 10B.

$$m \cdot \lambda = 2 \cdot d \cdot \sin(\Theta) \quad \text{Equation (A)}$$

$$\Theta = 90° - (\phi + \psi) \quad \text{Equation (B)}$$

$$\Lambda = d / \sin(\phi) \quad \text{Equation (C)}.$$

SUMMARY

A method of generating diffraction grating layers (hologram recording film) having different diffraction center wavelengths (reproduction center wavelengths) in advance and laminating the diffraction grating layers on one another while aligning the diffraction grating layers (referred to as a "first method according to a related art" for convenience) has been adopted so as to manufacture a diffraction grating member including multiple diffraction grating layers having interference fringes with different slant angles (inclination angles) $\phi$. Otherwise, a method of obtaining a diffraction grating member having a desired number of layers (referred to as a "second method according to a related art" for convenience) has been adopted. According to the second method, a hologram recording film including a single layer is obtained by forming interference fringes on the hologram recording film by performing an exposure attained by using a laser light beam, and fixing. After that, the above-described hologram recording film and a hologram recording film material are bonded together, and the interference fringes are formed by subjecting the bonded hologram recording film material to an exposure and fixing so that a hologram recording film including two layers is obtained. The above-described procedures are repeatedly performed so that the above-described diffraction grating member is obtained.

Since the above-described first and second methods are attained by performing a large number of steps, yields are reduced and the productivity is low. According to the second method, the hologram recording film material is repeatedly subjected to the exposure and the fixing in sequence. However, when the hologram recording film material is exposed, undesired interference fringes are formed on the hologram recording film material due to interference fringes formed on the hologram recording film that had already been formed as an underlayer. Further, the above-described second method has the problem of mixing of air bubbles or the like into the hologram recording film due to the manufacturing steps when the hologram recording film and the hologram recording film material are bonded together.

Further, if a light source includes a light emitting diode (LED), for example, the brightness of a light beam emitted from the second diffraction grating member 140 is determined based on the product of the distribution of light emission spectrums of the light source and the efficiency of diffraction attained by the diffraction grating member. Since the diffraction efficiency significantly depends on the wavelength of a light beam which is made incident on the diffraction grating member, it has been wished that the diffraction wavelength band of the diffraction grating member should be increased so that the brightness of an image generated through the image display device is increased.

Further, since incident angles at which the plurality of collimated light beams are made incident on the first diffraction grating member 130 differ based on the emission positions of the collimated light beams, the emission positions being defined on the image forming device 111, are emitted from the image forming device 111, the diffraction wavelengths satisfying the Bragg condition vary among various regions of the first diffraction grating member 130. As a result, the diffraction efficiency of a light beam which is diffracted and reflected in the various regions of the first diffraction grating member 130 is varied. According to the above-described configuration, if a light beam which is made incident on the first diffraction grating member 130 has a fixed wavelength band, the wavelength of the light beam diffracted at the maximum efficiency is varied based on the emission position from which the light beam is emitted, where the emission position is defined on the image forming device 111, and the hue of a pixel image led to the eyes 60 is varied due to the positions of pixels provided in the image forming device 111. Further, when a light beam which is made incident on the first diffraction grating member 130 has a single wavelength and the diffraction efficiency is varied based on a position from which the light beam is emitted, the position being defined on the image forming device 111, brightness variations occur.

Firstly, therefore, the present invention provides a hologram recording film manufacturing method in an embodiment which allows for manufacturing a hologram recording film having multiple diffraction grating layers having interference fringes with different slant angles (inclination angle) $\phi$ according to a simple method, a hologram recording film obtained through the above-described manufacturing method, and an image display apparatus including the hologram recording film.

Secondly, the present application provides a hologram recording film manufacturing method in an embodiment which allows for manufacturing a hologram recording film provided with regions having interference fringes with different slant angles (inclination angles) $\phi$ so as to reduce color variations and/or brightness variations occurring due to the incident angle of an incident collimated light beam according to a simple method.

Accordingly, a hologram recording film manufacturing method according to a first mode in an embodiment, which is attained to manufacture the hologram recording film having the multiple diffraction grating layers having the interference fringes with the different slant angles (inclination angle) $\phi$, includes the steps of (A) obtaining a laminated structure by alternately laminating M (where M≥2) photosensitive material precursor layers including a photosensitive material and at least one (M−1) resin layer on one another, (B) obtaining M photosensitive material layers, where at least two interference fringes with a desired pitch and a desired slant angle are formed on each of the M photosensitive material layers, from the M photosensitive material precursor layers by irradiating the laminated structure with a reference laser light beam and an object laser light beam, and (C) making the slant angles of the M photosensitive material layers different from each other while retaining a value of the pitch, the pitch being defined on a face of the photosensitive material layer, by irradiating the laminated structure with an energy ray from the laminated structure's one face side, and heating the laminated structure subsequently.

A hologram recording film according to an embodiment, which is attained to manufacture the hologram recording film having the multiple diffraction grating layers having the interference fringes with the different slant angles (inclination angle) $\phi$, includes a laminated structure including M (where M≥2) photosensitive material layers including a photosensitive material, where at least two interference fringes with a desired pitch and a desired slant angle are formed on each of the M photosensitive material layers, and at least one (M−1) resin layer that are alternately laminated on one another, wherein values of the pitches defined on faces of the M photosensitive material layers are identical to each other and the slant angles defined on the faces of the M photosensitive material layers are different from each other.

An image display apparatus according to the first mode in an embodiment, which is attained to manufacture the hologram recording film having the multiple diffraction grating layers having the interference fringes with the different slant angles (inclination angle) $\phi$, includes (A) an image forming device having a plurality of pixels arranged in a two-dimensional matrix form, (B) a collimating optical system configured to make a light beam emitted from each of the pixels into a collimated light beam, and (C) an optical device onto which the collimated light beam is made incident, in which the collimated light beam is guided, and from which the collimated light beam is emitted. Further, an image display apparatus according to the first mode, which is attained to manufacture the hologram recording film provided with the regions having the interference fringes with the different slant angles (inclination angles) $\phi$ so as to reduce the color variations and/or the brightness variations occurring due to the incident angle of the incident collimated light beam according to the simple method, includes (A) a light source, (B) a collimating optical system making a light beam emitted from the light source into a collimated light beam, (C) a scanning means configured to scan the collimated light beam emitted from the collimating optical system, (D) a relay optical system configured to relay the collimated light beam scanned through the scanning means, and (E) an optical device onto which the collimated light beam is made incident, in which the collimated light beam is guided, and from which the collimated light beam is emitted through the relay optical system. Further, an image display apparatus according to the first mode and/or the second mode includes (a) a light guide plate through which a light beam which is made incident on the light guide plate propagates through total reflection, and from which the light beam is emitted, (b) a first diffraction grating member provided in the light guide plate, the first diffraction grating member being configured to diffract and reflect the light beam which is made incident on the light guide plate so that the light beam which is made incident on the light guide plate is totally reflected inside the light guide plate, and (c) a second diffraction grating member provided in the light guide plate, the second diffraction grating member being configured to diffract and reflect the light beam which propagates through the light guide plate through the total reflection, and emit the light beam from the light guide plate, wherein each of the first and second diffraction grating members includes a hologram recording film having a laminated structure including M (where M≥2) photosensitive material layers including a photosensitive material, where at least two interference fringes with a desired pitch and a desired slant angle are formed on each of the M photosensitive material layers, and at least one (M−1) resin layer that are alternately laminated on one another, wherein values of the pitches defined on faces of the M photosensitive material layers are identical to each other and the slant angles defined on the faces of the M photosensitive material layers are different from each other.

Further, a hologram recording film manufacturing method according to the second mode in an embodiment, which is attained to manufacture the hologram recording film provided with the regions having the interference fringes with the different slant angles (inclination angles) φ so as to reduce the color variations and/or the brightness variations occurring due to the incident angle of the incident collimated light beam according to the simple method, includes the steps of (A) obtaining a photosensitive material layer on which at least two interference fringes with a desired pitch and a desired slant angle are formed from a photosensitive material precursor layer including a photosensitive material by irradiating the photosensitive material precursor layer with a reference laser light beam and an object laser light beam, and (B) making the slant angles observed in regions of the photosensitive material layer different from each other while retaining a value of the pitch, the pitch being defined on a face of the photosensitive material layer, by irradiating the regions with energy rays with different energy amounts, and heating the photosensitive material layer.

According to the hologram recording film manufacturing method according to the first mode in an embodiment, the laminated structure is irradiated with the reference laser light beam and the object laser light beam so that the interference fringes are recorded onto the photosensitive material (photopolymer) included in the photosensitive material precursor layer based on the refractive index modulation. Then, the laminated structure is irradiated with the energy ray from the laminated structure's one face side so that monomers included in the photosensitive material, the monomers being left without being polymerized at the laser irradiation time, are polymerized and fixed. Next, the laminated structure is heated so that the refractive index modulation factor is amplified. Through the heating, the refractive index modulation factor is increased and the slant angle (inclination angle) of the interference fringes is changed due to a thermal stress. Since only the slant angle is changed while the value Λ of a pitch observed on the surface of the photosensitive material layer is retained, the reproduction center wavelength (diffraction center wavelength) is shifted from state "a" to state "b" as shown in FIG. 6A. Thus, the laminated structure is irradiated with the energy ray from the laminated structure's one face side, and is heated so that the slant angles of the M photosensitive material layers are made different from each other while the value Λ of the pitch observed on the surface of the photosensitive material layer is retained. Consequently, the number of the steps is not increased and the productivity is high. Further, the manufacturing method reduces undesired interference fringes formed on the hologram recording film. Still further, the manufacturing method reduces the mixing of air bubbles or the like into the hologram recording film during the manufacturing steps. Further, since the manufacturing method allows for easily manufacturing a multilayer laminated structure, the diffractive wavelength band of the diffraction grating layer can further be increased and the brightness of an image generated through the image display apparatus can be increased with facility. Further, if an interference fringes allowing the shift amount of the reproduction center wavelength of each of the photosensitive material layers is recorded in advance, it becomes possible to arbitrarily design a desired reproduction center wavelength (diffraction center wavelength) and the bandwidth thereof.

Further, the hologram recording film manufacturing method according to the second mode in an embodiment allows for making the slant angles observed in the regions of the photosensitive material layer different from each other while retaining the value Λ of the pitch, the pitch being defined on the face of the photosensitive material layer, by irradiating the regions with energy rays with different energy amounts, and heating the photosensitive material layer. Consequently, the number of the steps is not increased and the productivity is high. Since the manufacturing method allows for making the slant angles observed in the regions of the photosensitive material layer different from each other, it becomes possible to reduce color variations and/or brightness variations caused by the incident angle of an incident collimated light beam.

Additional features and advantages are described herein, and will be apparent from the following Detailed Description and the figures.

BRIEF DESCRIPTION OF THE FIGURES

FIG. 1A is a schematic sectional view of a laminated structure or the like, which illustrates a hologram recording film manufacturing method according to a first embodiment;

FIG. 1B is a schematic sectional view of a laminated structure or the like, which illustrates the hologram recording film manufacturing method according to the first embodiment;

FIG. 1C is a schematic sectional view of a laminated structure or the like, which illustrates the hologram recording film manufacturing method according to the first embodiment;

DETAILED DESCRIPTION

Figure 2A:
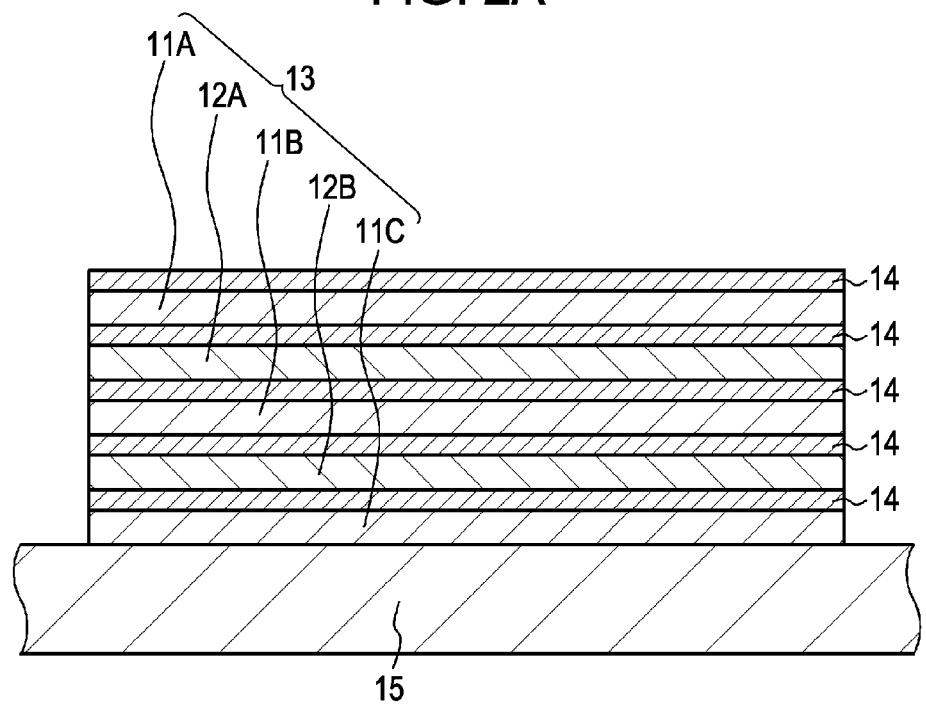
FIG. 2A is a schematic sectional view of a laminated structure or the like, which illustrates a hologram recording film manufacturing method according to a second embodiment.

The present application will be described with reference to the attached drawings according to an embodiment. Prior to that, a hologram recording film, a method of manufacturing same, and an image display apparatus according to an embodiment will be specifically described. Hereinafter, a photosensitive material precursor layer including a photosensitive material will often be referred to as a "first photosensitive material precursor layer" so as to discriminate between the above-described photosensitive material precursor layer and a second photosensitive material precursor layer. Further, a photosensitive material layer will often be referred to as a "first photosensitive material layer" so as to discriminate between the above-described photosensitive material layer and a second photosensitive material layer, and a photosensitive material included in the first photosensitive material precursor layer will often be referred to as a "first photosensitive material". Further, the term "photosensitive material precursor layers" may denote both the first and second photosensitive material precursor layers, and the term "photosensitive material layers" may denote both the first and second photosensitive material layers. Still further, the term "pitch" may denote a pitch defined on the face of the photosensitive material layer, and a pitch defined on the face of the photosensitive material layer may be referred to as a "face pitch".

Each of a hologram recording film obtained through a hologram recording film manufacturing method according to a first mode in an embodiment, a hologram recording film according to an embodiment, and a hologram recording film used for an image display apparatus according to the first mode and/or a second mode includes a laminated structure including M photosensitive material layers and at least one M−1 resin layer that are alternately laminated on one another. The above-described laminated structure includes a laminated structure including M photosensitive material layers and M resin layers that are alternately laminated on one another, and that including M photosensitive material layers and M+1 resin layers that are alternately laminated on one another.

When using the hologram recording film manufacturing method according to the first mode (hereinafter often abbreviated as a "manufacturing method according to the first mode"), a method of forming dry film-like photosensitive material precursor layers and laminating the dry film-like photosensitive material precursor layers on one another and/or a method of coating a supporting member including glass, a plastic, etc. with photosensitive materials in sequence in a desired order can be used as a method of forming the laminated structure. A coating method according to a related art may be used as the method of coating the photosensitive material, where the coating method according to the related art includes the die coating method, the gravure coating method, the roll coating method, the blade coating method, the curtain coating method, the dip coating method, the spin coating method, a printing method, etc. Further, not only a single layer coating method but also a method of coating a plurality of layers at the same time may be used, where the latter includes a multilayer slide coating method or the like. A protective layer (spacer layer) may be provided between the photosensitive material precursor layers by using a coating means and/or a laminating method according to a related art, as appropriate. An adhesive layer or the like may further be provided between the photosensitive material precursor layer and the protective layer. Further, when placing the dry film-like photosensitive material precursor layer that had already been formed on the supporting member for use, the photosensitive material precursor layer may be placed on the supporting member after the adhesive layer is provided on the supporting member on which the photosensitive material precursor layer is placed.

When the photosensitive material precursor layer is protected by the protective layer and the resin layer includes the second photosensitive material precursor layer including the second photosensitive material, a laminated structure having the following structure is obtained. Namely, the laminated structure includes the first first photosensitive material precursor layer/the protective layer/the first second photosensitive material precursor layer/the protective layer/the second first photosensitive material precursor layer/the protective layer/the second second photosensitive material precursor layer/the third first photosensitive material precursor layer/the protective layer, and so forth when the first photosensitive material precursor layers and the resin layers are laminated on one another. Otherwise, when the resin layer includes a film which absorbs part of an energy ray, a laminated structure having the following structure is obtained. Namely, the laminated structure includes the first first photosensitive material precursor layer/the protective layer/the resin layer/the second first photosensitive material precursor layer/the protective layer/the resin layer/the third first photosensitive material precursor layer/the protective layer, and so forth. The lamination of the first photosensitive material precursor layers and the resin layers may be performed according to a method appropriate for the above-described materials.

Further, when performing the manufacturing method according to the first mode and a hologram recording film manufacturing method according to the second mode in an embodiment, a laminated structure is irradiated with a reference laser light beam and an object laser light beam so that interference fringes with desired surface pitches and slant angles are formed. The above-described methods may be a method according to a related art. More specifically, for example, the laminated structure and/or the photosensitive material precursor layers may be irradiated with the object laser light beam from a first predetermined direction on one side at the same time as when the laminated structure and/or the photosensitive material precursor layer is irradiated with the reference laser light beam from the second predetermined direction on the other side so that interference fringes formed through the object laser light beam and the reference laser light beam are recorded in the laminated structure and/or the photosensitive material precursor layers. The first and second predetermined directions, and the wavelengths of the object laser light beam and the reference laser light beam should be appropriately selected so as to obtain the desired surface pitches and slant angles (inclination angles) of the interference fringes of the laminated structure and/or the photosensitive material precursor layers. Here, the slant angle of the interference fringe denotes an angle which the surface of the hologram recording film forms with the interference fringe.

Figure 6A:
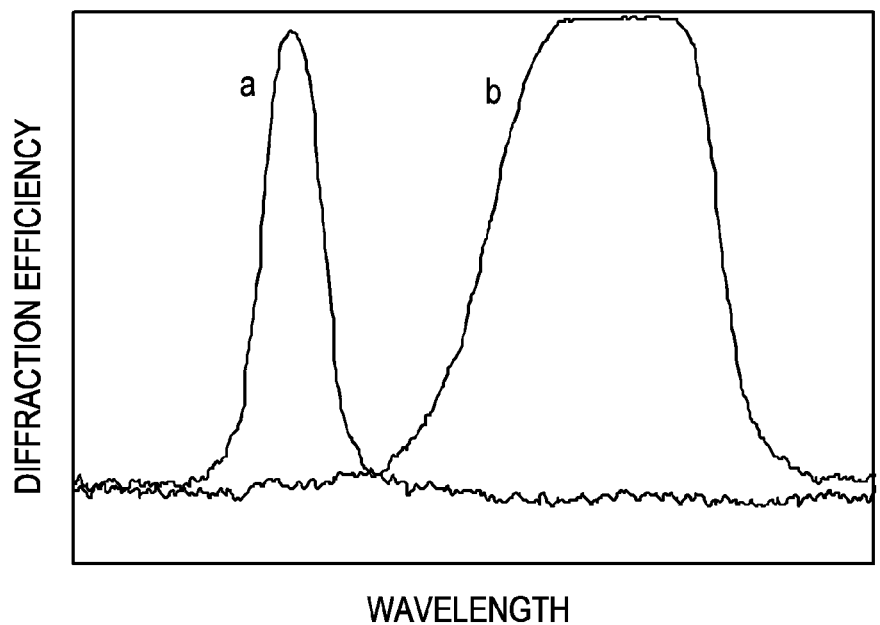
FIG. 6A is a graph showing the state where a reproduction center wavelength (diffraction center wavelength) is shifted from state "a" to state "b" when a photosensitive material layer is irradiated with an energy ray, and heated.
Figure 6B:
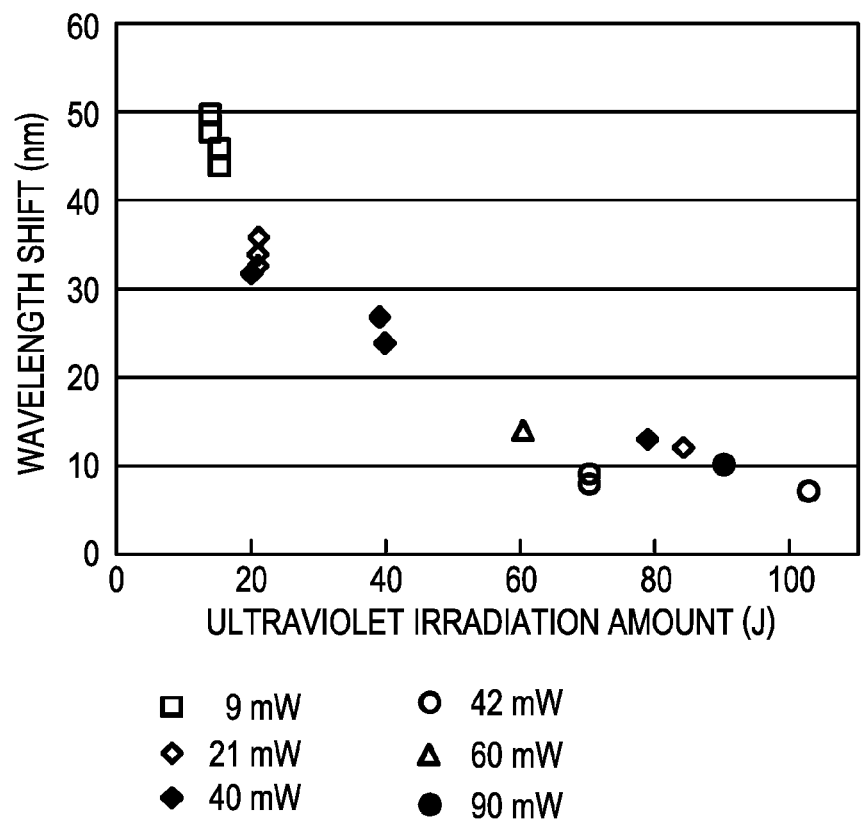
FIG. 6B is a graph showing the relationship between the energy ray irradiation amount and the amount of a change in a slant angle, the change occurring after the photosensitive material layer is heated.

The energy ray irradiation may be performed according to an appropriate method in accordance with an energy ray irradiation device (e.g., an ultraviolet lamp) for use. Heating may also be performed according to an appropriate method, such as using a heating lamp, a hot plate, a heating oven, etc. The heating temperature and the heating time may be appropriately determined based on materials included in the photosensitive material layers. Usually, as the amount of energy given to the photosensitive material layers through the energy ray irradiation is increased, the amount of changes in the slant angles, the changes being observed after the heating, is decreased as shown in FIG. 6B.

Specifically, when the hologram recording film manufacturing method according to the first mode and/or the second mode is performed, an ultraviolet ray may be used as the energy ray. Otherwise, an electron beam may be used. The wavelength, irradiation energy, irradiation time, and so forth of the ultraviolet ray for use may be appropriately determined based on the characteristics of the photosensitive material.

When the hologram recording film manufacturing method of the first mode, the method having the above-described configurations, and/or a hologram recording film according to an embodiment is used, the reproduction center wavelength of M first photosensitive material layers (the first diffraction grating layers) is changed based on the value of M (for example, the reproduction center wavelength is monotonously changed). Namely, when the energy ray irradiation amount is made constant, the difference between a reproduction center wavelength obtained before the energy ray irradiation is performed and that obtained after the energy ray irradiation is performed is increased as the value of M is increased. Further, when the energy ray irradiation amount is changed, it may be arranged that the difference between the reproduction center wavelength obtained before the energy ray irradiation is performed and that obtained after the energy ray irradiation is performed is decreased as the energy ray irradiation amount is increased.

When the hologram recording film manufacturing method according to the first mode, the method having the above-described configuration and form, is used, the resin layer includes the second photosensitive material precursor layer including a second photosensitive material, and, at the above-described step (B), the laminated structure is irradiated with the reference laser light beam and the object laser light beam so that the M first photosensitive material layers on which the interference fringes with the desired pitches (surface pitches) and slant angles are formed are obtained from M first photosensitive material precursor layers. At the same time, at least one M−1 second photosensitive material layer on which second interference fringes with desired pitches (surface pitches) and slant angles are formed are obtained from at least one M−1 second photosensitive material precursor layer. The above-described manufacturing method will be referred to as a "first configuration manufacturing method" for convenience. If the value of M−1 is two or more, the laminated structure is irradiated with an energy ray from the laminated structure's first first photosensitive material layer side, and heated at the above-described step (C) so that the slant angles of the M first photosensitive material layers (the first diffraction grating layers) are made different from each other and those of the M−1 second photosensitive material layers (the second diffraction grating layers) are made different from one another while retaining the value $\Lambda$ of the surface pitch. Further, the reproduction center wavelength of the M−1 second photosensitive material layers (the second diffraction grating layers) may be changed based on the value of M (changed monotonously, for example).

According to the first configuration manufacturing method, the photosensitive characteristic-for-an energy ray of the first photosensitive material layers may be different from that of the second photosensitive material layers. Otherwise, the photosensitive characteristics-for-the reference laser light beam and the object laser light beam of the first photosensitive material precursor layer may be different from those of the second photosensitive material layers. In that case, the first photosensitive material precursor layers should be irradiated with the first reference laser light beam and the first object laser light beam, and the second photosensitive material precursor layers should be irradiated with the second reference laser light beam and the second object laser light beam, at the above-described step (B). Further, the laser light beam irradiation for the first photosensitive material precursor layers and that for the second photosensitive material precursor layers may be performed at the same time or separately.

According to the first configuration manufacturing method, the photosensitive characteristic-for-the energy ray of the first photosensitive material layers may be different from that of the second photosensitive material layers. Consequently, it becomes possible to make the amount of energy with which the m-th (where the equation m=1, 2, . . . , M holds) first photosensitive material layer is irradiated different from that of energy with which the m'-th (where the equation m'=1, 2, . . . , M−1 holds) second photosensitive material layer is irradiated. As a result, the slant angles of the M first photosensitive material layers can be made different from each other and those of the M−1 second photosensitive material layers can be made different from each other. Further, by making the photosensitive characteristics-for-the reference laser light beam and the object laser light beam of the first photosensitive material precursor layer different from those of the second photosensitive material layers, the slant angles of the M first photosensitive material layers can be made different from each other and those of the M−1 second photosensitive material layers can be made different from each other. Further, by irradiating the first photosensitive material precursor layers with the first reference laser light beam and the first object laser light beam and irradiating the second photosensitive material precursor layers with the second reference laser light beam and the second object laser light beam, the pitches (surface pitches) and the slant angles of the interference fringes formed on the first photosensitive material precursor layers can be made different from those of the interference fringes formed on the second photosensitive material precursor layers.

Although the main compositions of the first and second photosensitive materials are identical to each other, the energy ray transmittance and/or the transmitted energy ray amount of the first photosensitive material may be different from that of the second photosensitive material. Otherwise, the main compositions of the first and second photosensitive materials may be made different from each other so that the energy ray transmittance and/or the transmitted energy ray amount of the first photosensitive material becomes different from that of the second photosensitive material. In the case where the energy ray transmittance and/or the transmitted energy ray amount of the first photosensitive material is different from that of the second photosensitive material even though the main compositions of the first and second photosensitive materials are identical to each other, the amount of an energy ray absorbent (e.g., an ultraviolet absorbent) included in the first photosensitive material is different from that included in the second photosensitive material, for example. Otherwise, the amount of a reaction initiator (e.g., an ultraviolet reaction initiator), which is determined based on the energy rays, included in the first photosensitive material is different from that included in the second photosensitive material, for example. Namely, the chemical reaction for the energy rays, which occurs in the first photosensitive material, becomes different from that occurring in the second photosensitive material, for example. If the main compositions of the first photosensitive materials included in the individual M first photosensitive material layers are identical to each other, the energy ray transmittances and/or the transmitted energy ray amounts of the individual first photosensitive materials may be slightly different from one another. Likewise, if the main compositions of the second photosensitive materials included in the individual M−1 second photosensitive material layers are identical to each other, the energy ray transmittances and/or the transmitted energy ray amounts of the individual second photosensitive materials may be slightly different from each other.

When the hologram recording film manufacturing method according to the first mode, the method having the above-described configuration and form, is used, the resin layer may include a film absorbing part of the energy ray. The above-described manufacturing method will be referred to as a "second configuration manufacturing method" for convenience. Here, the resin layer may have an absorbing characteristic so that the resin layer absorbs 5% or more of ultraviolet radiation having a wavelength of 400 nm or less. More specifically, a film including an acrylic-based resin, an acrylic acid ester-based resin, a methacrylic acid resin, an epoxy-based resin, a urethane-based resin, a polyvinyl ether resin, a polycarbonate resin, a polyamide resin, a polyvinyl acetate, a vinyl chloride-based resin, a urea-based resin, a styrene-based resin, a butadiene-based resin, a natural rubber-based resin, a polyvinyl carbazole, a polyethylene glycol, a phenol-based resin may be exemplarily used as a film absorbing part of an energy ray.

Further, each of the above-described resins may include a material which absorbs an energy ray (e.g., an ultraviolet absorbent) as appropriate. A material according to a related art may be used as the above-described material. Each of the above-described films may be formed according to an application method, or a film that had already been formed may be placed.

In the case where a hologram recording film according to an embodiment, and an image forming device according to the first mode and/or the second mode are used, the resin layer may include the M−1 second photosensitive material layers (the second diffraction grating layers) including the second photosensitive material, where interference fringes having desired pitches (surface pitches) and slant angles are formed on the M−1 second photosensitive material layers. The above-described hologram recording film will be referred to as a "first configuration hologram recording film" for convenience. When the value of M−1 is two or more, the surface pitches of the individual M−1 second photosensitive material layers are identical to one another and the slant angles of the individual M−1 second photosensitive material layers are different from one another.

In another case, when a hologram recording film according to an embodiment, and the image display apparatus according to the first mode and/or the second mode are used, the resin layer may include a film absorbing part of an energy ray. Further, the above-described hologram recording film will be referred to as a "second configuration hologram recording film" for convenience. Details of the resin layer are the same as those of the above-described resin layer.

When the hologram recording film manufacturing method according to the second mode, the method having the above-described form, is used, individual regions of the photosensitive material layer are irradiated with energy rays with different energy amounts, where the energy amount may be changed seamlessly or in stages. Further, the reproduction center wavelengths of the individual regions of the photosensitive material layer (diffraction grating layer) may be different from one another. Still further, as the irradiation amount of the energy ray is decreased, the reproduction center wavelength approaches the long wavelength side. Namely, as the irradiation amount of the energy ray is decreased, the difference between the reproduction center wavelength obtained before the energy ray irradiation is performed and that obtained after the energy ray irradiation is performed may be increased.

If a photopolymer material included in the photosensitive material precursor layer may be any photopolymer material including, at least, a photopolymerizable compound, a binder resin, and a photopolymerization initiator. The photopolymerizable compound may be a photopolymerizable compound according to a related art, which includes an acrylic-based monomer, a methacrylic-based monomer, a styrene-based monomer, a butadiene-based monomer, a vinyl-based monomer, an epoxy-based monomer, and so forth. Each of the above-described monomers may be a copolymer, and a monofunctional material and/or a polyfunctional material. The above-described monomers may be used singly or in combination. Further, any binder resin according to a related art may be used as the above-described binder resin. More specifically, a cellulose acetate-based resin, an acrylic-based resin, an acrylic acid ester-based resin, a methacrylic acid resin, an epoxy-based resin, a urethane-based resin, a polypropylene resin, a polyvinyl ether resin, a polycarbonate resin, a polyamide resin, a polyvinyl acetate, a vinyl chloride-based resin, a urea-based resin, a styrene-based resin, a butadiene-based resin, a natural rubber-based resin, a polyvinyl carbazole, a polyethylene glycol, a phenol-based resin, a copolymer including the above-described resins, gelatin, and so forth may be used. The binder resins may also be used singly or in combination. Any photopolymerization initiator according to a related art may be used as the above-described photopolymerization initiator. The photopolymerization initiators may be used singly or in combination. Further, the photopolymerization initiator may be used in combination with at least one photosensitizer pigment. A plasticizer, a chain transfer agent, and other additives may be added to the photosensitive material precursor layer, as appropriate. The protective layer may include any transparent material. The protective layer may be formed through coating and/or a material made into a film may be laminated onto the photosensitive material precursor layer. The material included in the protective layer may be, for example, a polyvinyl alcohol (PVA) resin, the acrylic resin, a polyurethane resin, a polyethylene terephthalate (PET) resin, a cellulose triacetate (TAC) resin, a polymethyl methacrylate (PMMA) resin, the polypropylene resin, the polycarbonate resin, and a polyvinyl chloride resin.

An image forming device provided in the image display apparatus according to the first mode may be, for example, an image forming device including a reflection type spatial light modulation device and a light source, an image forming device including a transmission type spatial light modulation device and a light source, and an image forming device provided with a light emitting element including an organic electroluminescent (EL) element, an inorganic EL element, a light emitting diode (LED), and so forth. Of the above-described image forming devices, however, the image forming device including the reflection type spatial light modulation device and the light source should be used. Here, the spatial light modulation device may include a transmission type and/or reflection type liquid crystal display apparatus including a light valve such as a liquid crystal on silicon (LCOS), and a digital micromirror device (DMD), and the light source may include, for example, the light emitting element. Further, the reflection-type spatial light modulation device may include a liquid crystal display apparatus and a polarization beam splitter that reflects part of light emitted from the light source, leads the light to the liquid crystal display apparatus, makes part of the light reflected by the liquid crystal display apparatus pass, and leads the light to a collimating optical system. The light emitting element included in the light source may be a red light emitting element, a green light emitting element, a blue light emitting element, and a white light emitting element. Further, a semiconductor laser element and/or an LED can be exemplified as the light emitting element. The number of pixels may be determined based on appropriate specifications of the image display apparatus. More specifically, the pixel number may be 320×240, 432×240, 640×480, 1024×768 and 1920×1080.

An image forming device provided in the image display apparatus according to the second mode may include a light emitting element functioning as a light source. More specifically, the light emitting element may include the red light emitting element, the green light emitting element, the blue light emitting element, and the white light emitting element. Further, a semiconductor laser element and/or an LED can be exemplified as the light emitting element. The number of pixels (virtual pixels) provided in the above-described image display apparatus may be determined based on appropriate specifications of the image display apparatus. More specifically, the number of the pixels (virtual pixels) may be 320×240, 432×240, 640×480, 1024×768 and 1920×1080. Further, when the light source includes the red light emitting element, the green light emitting element, and the blue light emitting element, color synthesis may be performed through the use of a cross prism. As a scanning unit, a micro electro mechanical system (MEMS) such as a DMD and/or a galvanometer mirror, which performs horizontal scanning and vertical scanning for a light beam emitted from the light source may be used. A relay optical system may include a relay optical system according to a related art.

In addition to a combination of the image forming device including the light emitting elements and the light valve and/or a backlight which entirely emits white light as the light source and a liquid crystal display apparatus including red light emitting pixels, green light emitting pixels, and blue light emitting pixels, the following configurations may be exemplified.

[Image Forming Device-A]

An image forming device-A includes:

(α) a first image forming device including a first light emitting panel provided with first light emitting elements emitting blue light beams, where the first light emitting elements are arranged in a two-dimensional matrix form, (β) a second image forming device including a second light emitting panel provided with second light emitting elements emitting green light beams, where the second light emitting elements are arranged in the two-dimensional matrix form, (γ) a third image forming device including a third light emitting panel provided with third light emitting elements emitting red light beams, where the third light emitting elements are arranged in the two-dimensional matrix form, and (δ) a unit provided to bring together the light beams that are emitted from the first, second, and third image forming devices into a single optical path (e.g., a dichroic prism as is the case with the following descriptions), and controls the light emission/non-light emission state of each of the first, second, and third light emitting elements.

[Image Forming Device-B]

An image forming device-B includes:

(α) a first image forming device including a first light passage control device provided to control the first light emitting element emitting a blue light beam and the passage and/or the non-passage of the light beam emitted from the first light emitting element, where the first light passage control device is a type of light valve, and includes a liquid crystal display apparatus, a DMD, a liquid crystal on silicon (LCOS), and so forth, as is the case with the following descriptions, (β) a second image forming device including a second light passage control device (light valve) provided to control the second light emitting element emitting a green light beam and the passage and/or the non-passage of the light beam emitted from the second light emitting element, (γ) a third image forming device including a third light passage control device (light valve) provided to control the third light emitting element emitting a red light beam and the passage and/or the non-passage of the light beam emitted from the third light emitting element, and (δ) a unit provided to bring together the light beams passing through the first, second, and third light passage control devices into a single optical path, and displays an image by controlling the passage and/or the non passage of the light beams emitted from the above-described light emitting elements through the light passage control devices. A light guide member, a microlens array, a mirror and/or a reflector, a condensing lens may be exemplified as a unit (light guide member) provided to lead the light beams emitted from the first, second, and third light emitting elements to the light passage control devices.

[Image Forming Device-C]

An image forming device-C includes:

(α) a first image forming device including a first light emitting panel provided with first light emitting elements emitting blue light beams, where the first light emitting elements are arranged in a two-dimensional matrix form, and a blue light passage control device (light valve) provided to control the passage and/or the non-passage of the light beam emitted from the first light emitting panel, (β) a second image forming device including a second light emitting panel provided with second light emitting elements emitting green light beams, where the second light emitting elements are arranged in a two-dimensional matrix form, and a green light passage control device (light valve) provided to control the passage and/or the non-passage of the light beam emitted from the second light emitting panel, (γ) a third image forming device including a third light emitting panel provided with third light emitting elements emitting red light beams, where the third light emitting elements are arranged in a two-dimensional matrix form, and a red light passage control device (light valve) provided to control the passage and/or the non-passage of the light beam emitted from the third light emitting panel, and (δ) a unit provided to bring together the light beams passing through the blue light passage control device, the green light passage control device, and the red light passage control device into a single optical path, and displays an image by controlling the passage and/or the non passage of the light beams emitted from the first, second, and third light emitting panels through the light passage control devices (light valves).

[Image Forming Device-D]

An image forming device D is configured to display a color image under the field sequential system, and includes (α) a first image forming device including at least one first light emitting element emitting a blue light beam, (β) a second image forming device including at least one second light emitting element emitting a green light beam, and (γ) a third image forming device including at least one third light emitting element emitting a red light beam, and (δ) a unit provided to bring together the light beams emitted from the first, second, and third image forming devices into a single optical path, and (ε) a light passage control device (light valve) configured to control the passage and/or the non-passage of the light beams emitted from the above-described unit, wherein the image forming device displays an image by controlling the passage and/or the non-passage of the light beams emitted from the above-described light emitting elements through the light passage control device.

[Image Forming Device-E]

An image forming device E is also configured to display a color image under the field sequential system, and includes (α) the first image forming device including the first light emitting panel provided with the first light emitting elements emitting blue light beams, where the first light emitting elements are arranged in the two-dimensional matrix form, (β) the second image forming device including the second light emitting panel provided with the second light emitting elements emitting green light beams, where the second light emitting elements are arranged in the two-dimensional matrix form, (γ) the third image forming device including the third light emitting panel provided with the third light emitting elements emitting red light beams, where the third light emitting elements are arranged in the two-dimensional matrix form, and (δ) the unit provided to bring together the light beams that are emitted from the individual first, second, and third image forming devices into a single optical path, and (ε) the light passage control device (light valve) configured to control the passage and/or the non-passage of the light beams emitted from the above-described unit, wherein the image forming device-E displays an image by controlling the passage and/or the non-passage of the light beams emitted from the above-described light emitting panels through the light passage control device.

[Image Forming Device-F]

An image forming device F is a passive matrix-type and/or active matrix-type image forming device displaying a color image by controlling the light emission state and/or the non-light emission state of each of the first, second, and third light emitting elements.

[Image Forming Device-G]

An image forming device-G is an image forming apparatus displaying a color image under the field sequential system. The image forming device-G includes a light passage control device (light valve) configured to control the passage and/or the non-passage of light beams emitted from light emitting element units that are arranged in a two-dimensional matrix form, performs time-division control for the light emission state and/or the non-light emission state of each of the first, second, and third light emitting elements provided in the light emitting element units, and controls the passage and/or the non-passage of light beams emitted from the first, second, and third light emitting elements through the light passage control device so that the color image is displayed.

According to the image display apparatus according to the first mode and/or the second mode, the light beams are made into collimated light beams and are made incident on a light guide plate. The reason why the light beams are collimated is that light wavefront information obtained when the above-described light beams are made incident on the light guide plate should be stored after the light beams are emitted from the light guide plate via first and second diffraction grating members. More specifically, for generating the collimated light beams, the image forming device may be arranged, for example, at the place (position) of a focal length defined in a collimating optical system. Here, the collimating optical system has a function of converting information about the pixel position into angle information of an optical system provided in an optical device.

In the image display apparatus according to the first mode and/or the second mode, the light guide plate has two parallel faces (the first and second faces) extending in parallel with the axis line (Y-direction) of the light guide plate. Here, when the face of the light guide plate, on which the light beams are made incident, is determined to be the light guide plate-incident face and the face of the light guide plate, from which the light beams are emitted, is determined to be the light guide plate-emission face, the light guide plate-incident face and the light guide plate-emission face may be defined on the first face. Otherwise, the light guide plate-incident face may be defined on the first face and the light guide plate-emission face may be defined on the second face.

Materials included in the light guide plate may be glass such as optical glass including silica glass, BK7, and so forth and/or a plastic material including the PMMA, the polycarbonate resin, the acrylic-based resin, an amorphous polypropylene-based resin, a styrene-based resin including an acrylonitrile styrene (AS) resin, and so forth. Without being limited to the flat shape, the light guide plate may have any shape and be curved.

As the collimating optical system included in the image display apparatus according to the first mode and/or the second mode, an optical system using a convex lens, a concave lens, a free form surface prism, and a hologram lens singly or in combination may be exemplified, where the optical system has a positive optical power on the whole.

The use of the image display apparatus according to the first mode and/or the second mode allows for, for example, configuring a light weight and small head mounted display (HMD), significantly reducing user discomfort caused by the HMD placed on the user's head, and reducing the manufacturing cost.

First Embodiment

A first embodiment relates to the hologram recording film manufacturing method according to the first mode. More specifically, the first embodiment relates to the first configuration manufacturing method, and a hologram recording film according to an embodiment. More specifically, the first embodiment relates to the first configuration hologram recording film.

As shown in a schematic sectional view of FIG. 1C, a hologram recording film 30 according to the first embodiment includes a laminated structure 33 having the M (where the expression M≥2 holds, and the equation M=2 holds in the first embodiment) first photosensitive material layers (the first diffraction grating layers) 31A and 31B including the first photosensitive material, and at least one M−1 resin layer that are alternately laminated on one another, where interference fringes having desired surface pitches and slant angles are formed on the M first photosensitive material layers 31A and 31B. The values of the pitches observed on the faces (surface pitches) of the individual M first photosensitive material layers 31A and 31B are identical to each other, and the slant angles of the individual M first photosensitive material layers 31A and 31B are different from each other.

In each of FIGS. 1B and 1C, and/or FIGS. 2B, 3, 4B, and 5 that will be described later, each of protective layers 14 is not diagonally shaded. Further, in each of FIGS. 1B and 1C, and/or FIGS. 2B, 3, 4B, and 5 that will be described later, each of the first photosensitive material layers 31A, 31B, and 31C, and second photosensitive material layers 32A and 32B is diagonally shaded. The above-described shading schematically shows the interference fringes.

Here, in the first embodiment, the resin layer includes a second photosensitive material precursor layer 12A including the second photosensitive material. Further, the resin layer includes at least one M−1 (specifically, M−1 denotes one in the first embodiment) second photosensitive material layer (the second diffraction grating layer) 32A on which interference fringes with a desired surface pitch and a desired slant angle are formed.

Figure 7:
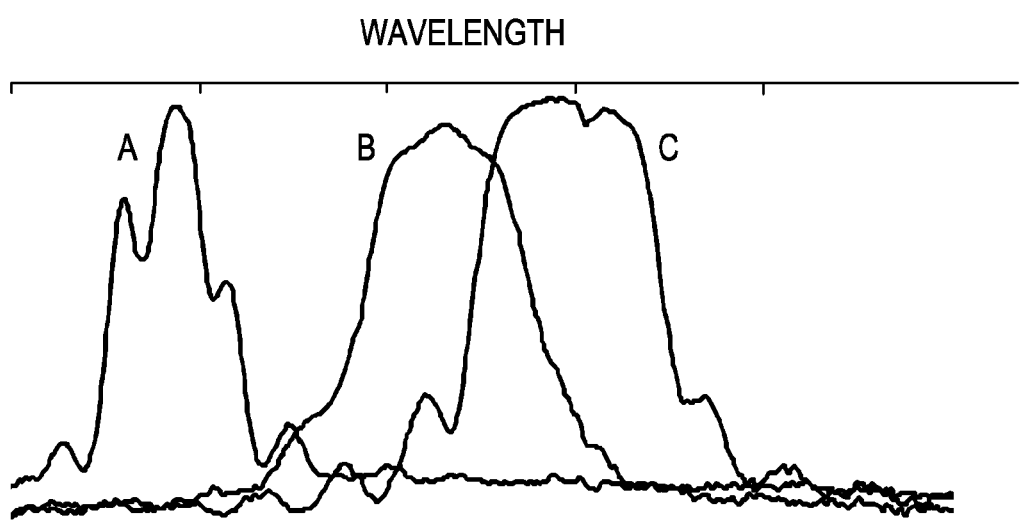
FIG. 7 is a graph showing changes in diffraction wavelength bands, where the change occur when the same photosensitive material layers including two layers are irradiated with energy rays, and heated.

The values of the surface pitches, the slant angles, and the reproduction center wavelengths (λ) of the first first photosensitive material layer 31A, which denotes the first layer of the first photosensitive material layers (hereinafter the above-described designation scheme is also applied to any other photosensitive material layer), the second first photosensitive material layer 32A, and the first second photosensitive material layer 31B are exemplarily shown in Table 1 as below. Here, in Table 1 and/or Tables 3 and 5 which will be described later, the value shown before the sign "/" used for each of the slant angle values and the reproduction center wavelengths denotes a value obtained after the photosensitive material layer is heated. Further, the value shown after the sign "/" is a value obtained before the photosensitive material layer is heated. Since the first first photosensitive material layer includes the same photosensitive material as that of the second first photosensitive material layer, the diffraction wavelength bands thereof, which are observed before the above-described photosensitive material layers are heated, are the same as each other as shown in FIG. 7 (refer to peak "A" shown in FIG. 7). However, after being heated, the diffraction wavelength band of the first first photosensitive material layer is changed differently from that of the second first photosensitive material layer as indicated by peaks "C" and "B" that are shown in FIG. 7.

TABLE 1

| | Surface Pitch | Slant Angle | Reproduction Center Wavelength (λ) |
|---|---|---|---|
| First first photosensitive material layer | 0.4 μm | 31.6°/29.5° | 626 nm/596 nm |
| First second photosensitive material layer | 0.3 μm | 32.2°/29.5° | 455 nm/427 nm |
| Second first photosensitive material layer | 0.4 μm | 32.9°/29.5° | 644 nm/596 nm |

As described above, the surface pitches of the M first photosensitive material layers 31A and 31B are different from that of the M−1 second photosensitive material layer 32A. Further, each of the reproduction center wavelengths of the M first photosensitive material layers 31A and 31B approaches the long wavelength side as the value M is increased. Namely, as the energy ray irradiation amount is decreased, the difference between the reproduction center wavelength obtained before the energy ray irradiation is performed and that obtained after the energy ray irradiation is performed is increased.

Hereinafter, the hologram recording film manufacturing method according to the first embodiment, more specifically, the first configuration manufacturing method will be described. In the first embodiment, the photosensitive characteristic-for-energy ray of the first photosensitive material layer is different from that of the second photosensitive material layer. More specifically, even though the first photosensitive material included in the first photosensitive material layer has the same main composition as that of the second photosensitive material included in the second photosensitive material layer, the transmitted energy ray amount of the first photosensitive material is different from that of the second photosensitive material. More specifically, since each of the photosensitive material layers absorbs an energy ray, the transmitted energy ray amounts of the photosensitive material layers are different from one another. Specifically, the energy ray may be an ultraviolet ray having a wavelength of 365 nm. Further, the photosensitive characteristics-for-reference laser light and object laser light of the first photosensitive material precursor layer are different from those of the second photosensitive material precursor layer.

[Step-100]

First, M (where the expression M≥2 holds, and the equation M=2 holds in the first embodiment) first photosensitive material layers 11A and 11B that include the first photosensitive material and at least one M−1 resin layer are alternately laminated on one another so that a laminated structure 13 is obtained (refer to FIG. 1A).

Specifically, a PVA (NH-18 manufactured by Nippon Synthetic Chemical Industry Co., Ltd) is applied onto a support film including a PET and dried so that the protective layer 14 having a thickness of 5 μm is provided. Next, a photopolymer having a photosensitive characteristic for green laser light (HRS 700×380 including a green pigment for exposure, which is manufactured by Du Pont Kabushiki Kaisha) is applied onto the protective layer 14 so as to obtain the first photosensitive material precursor layers 11A and 11B with a thickness of 10 μm and cohesiveness. Similarly, a photopolymer having a photosensitive characteristic for blue laser light (HRS 700×380 including a blue pigment for exposure, which is manufactured by Du Pont Kabushiki Kaisha) is applied onto the protective layer 14 so as to obtain a second photosensitive material precursor layers 12A with a thickness of 10 μm and cohesiveness. The obtained first photosensitive material precursor layer 11B is placed on a support member 15 including a glass plate and the support film is removed. Then, the second photosensitive material precursor layer 12A is placed on the protective layer 14 provided on the first photosensitive material precursor layer 11B and the support film is removed. After that, the first photosensitive material precursor layer 11A is placed on the protective layer 14 provided on the second photosensitive material precursor layer 12A, and the support film is removed. Thus, as shown in a schematic sectional view of FIG. 1A, the second first photosensitive material precursor layer 11B, the protective layer 14, the first second photosensitive material precursor layer 12A, the protective layer 14, the first first photosensitive material precursor layer 11A, and the protective layer 14 are laminated onto the support member 15 so as to obtain the laminated structure 13.

[Step-110]

Next, the laminated structure is irradiated with the reference laser light beam and the object laser light beam so that the M first photosensitive material layers 21A and 21B on which interference fringes with desired pitches (surface pitches) and slant angles are formed are obtained from the M first photosensitive material precursor layers 11A and 11B. In addition to that, at least one M−1 second photosensitive material layer 22A on which second interference fringes with desired pitches (surface pitches) and slant angles are formed are obtained from the M−1 second photosensitive material precursor layer 12A (refer to FIG. 1B).

Specifically, the first photosensitive material precursor layers 11A and 11B are irradiated with the first reference laser light beam and the first object laser light beam, and the second photosensitive material precursor layer 12A is irradiated with the second reference laser light beam and the second object laser light beam. More specifically, the laminated structure 13 is secured to a prism for exposure through refractive oil. Then, the first photosensitive material precursor layers 11A and 11B are irradiated with the first reference light beam and the first object laser light beam that are emitted from a YAG laser (second harmonic generation (SHG)) configured to emit a green light beam having a wavelength of 532 nm. At the same time, the second photosensitive material precursor layer 12A is irradiated with the second reference laser light beam and the second object laser light beam that are emitted from an argon (Ar) laser configured to emit a blue light beam having a wavelength of 457 nm.

Figure 9:
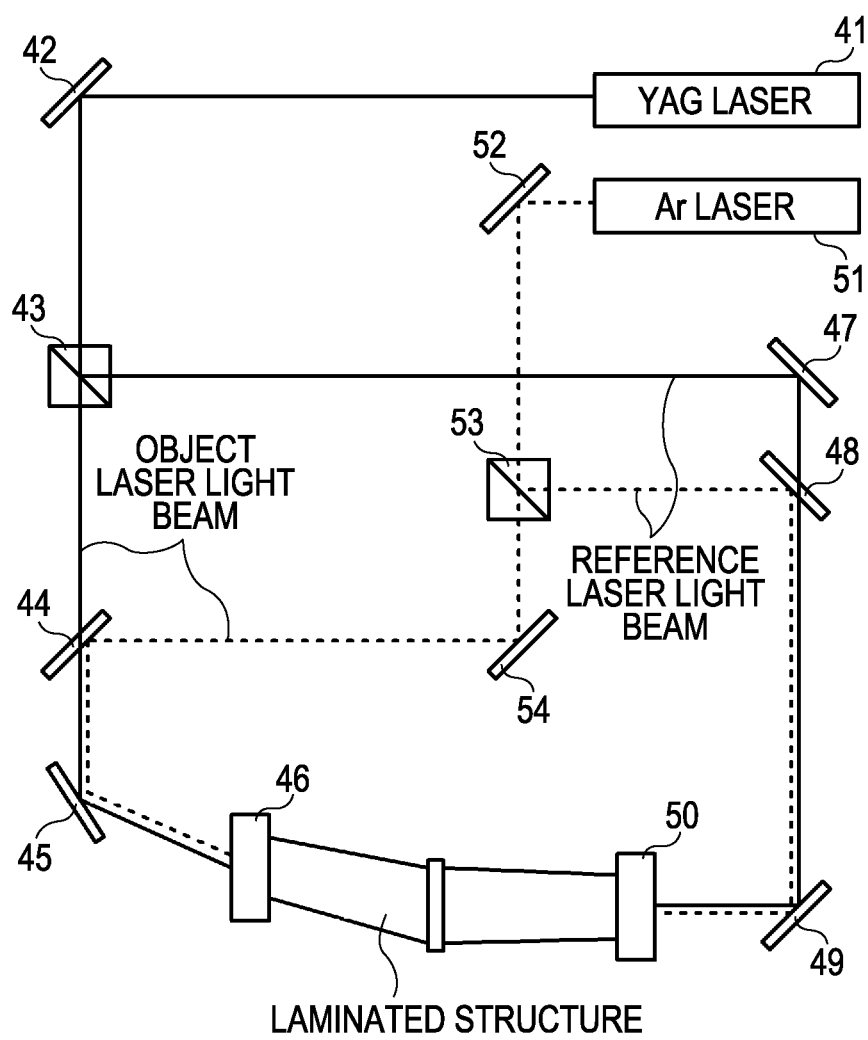
FIG. 9 is a conceptual illustration of an exposure system configured to irradiate a laminated structure with a reference laser light beam and an object laser light beam.

An exposure system schematically shown in FIG. 9 includes laser light sources (a laser light source 41 including the YAG laser and a laser light source 51 including the argon (Ar) laser), where each of the laser light sources is configured to emit a laser light beam having a predetermined wavelength, and variable beam splitters 43 and 53 that are arranged on optical axes of the laser light beams emitted from the individual laser light sources 41 and 51. The variable beam splitters 43 and 53 are provided to separate the laser light beams that are emitted from the individual laser light sources 41 and 51 into the reference laser light beams and the object laser light beams.

More specifically, the laser light beam emitted from the laser light source 41 is totally reflected by a total reflection mirror 42, and is made incident on the variable beam splitter 43. Here, the laser light beam reflected by the variable beam splitter 43 becomes the reference laser light beam, and the laser light beam which passes through the variable beam splitter 43 becomes the object laser light beam. Further, the laser light beam emitted from the laser light source 51 is totally reflected by a total reflection mirror 52, and is made incident on the variable beam splitter 53. The laser light beam reflected by the variable beam splitter 53 becomes the reference laser light beam, and the laser light beam which passes through the variable beam splitter 53 becomes the object laser light beam. Here, the reference laser light beams of the individual colors, which are separated through the variable beam splitters 43 and 53 are subjected to color synthesis through a dichroic mirror 48. The reference laser light beam subjected to the color synthesis is made incident on the laminated structure via a beam shaping optical system 50 provided for a reference laser light beam. Here, total reflection mirrors 47 and 49 are provided in the optical path of the above-described reference laser light beam so as to change the travel direction of the reference laser light beam. On the other hand, the object laser light beams of the individual colors, which are separated through the variable beam splitters 43 and 53 are subjected to color synthesis through a dichroic mirror 44. The object laser light beams subjected to the color synthesis are made incident on the laminated structure via a beam shaping optical system 46 provided for the object laser light beams. Here, total reflection mirrors 45 and 54 are provided in the optical path of the above-described reference laser light beam so as to change the travel direction of the object laser light beam. Consequently, the reference laser light beam and the object laser light beam interfere with each other inside the photosensitive material precursor layer included in the laminated structure, and interference fringes caused by the reference laser light beam and the object laser light beam interfering with each other are recorded in the photosensitive material precursor layer as changes in the refractive index. In the above-described embodiment, multi-wavelength simultaneous exposure has been exemplarily described. Namely, the blue laser light beam and the green laser light beam are subjected to the color synthesis and the laminated structure is irradiated with the blue laser light beam and the green laser light beam at the same time so that the laminated structure is exposed. However, the laminated structure may be irradiated with the blue laser light beam and the green laser light beam separately and sequentially. Namely, the laminated structure may be subjected to multi-wavelength sequential exposure. Since the above-described configuration is also applied to the red laser light beam, the description thereof is omitted. Further, the laminated structure may be exposed to the three color laser light beams at the same time and in sequence.

[Step-120]

After that, the laminated structure 23 is irradiated with an energy ray from the laminated structure 23's one face side, and heated. Consequently, the slant angles of the M first photosensitive material layers 31A and 31B become different from each other while the value A of the surface pitch is retained.

Specifically, the laminated structure 23 is irradiated with an ultraviolet ray from the first first photosensitive material layer 21A's side. The ultraviolet irradiation amount is determined to be 22 Joules. When the ultraviolet ray passes through the first photosensitive material layer 21A, the second photosensitive material layer 22A, and the first photosensitive material layer 21B, about 50 percent of the energy thereof is absorbed by each of the first photosensitive material layer 21A, the second photosensitive material layer 22A, and the first photosensitive material layer 21B. Consequently, the amounts of ultraviolet with which the photosensitive material layers 21A, 22A, and 21B are irradiated are as shown in Table 2 that follows. After that, the laminated structure 23 is heated to 100° C. for eighty minutes through an oven. After that, the support member 15 is removed so that the hologram recording film 30 according to the first embodiment is obtained, where the hologram recording film 30 has the configuration shown in FIG. 1C.

TABLE 2

|  | Ultraviolet irradiation amount (Joule) |
|---|---|
| First first photosensitive material layer 21A | 22 |
| First second photosensitive material layer 22A | 11 |
| Second first photosensitive material layer 21B | 5.5 |

Figure 8A:
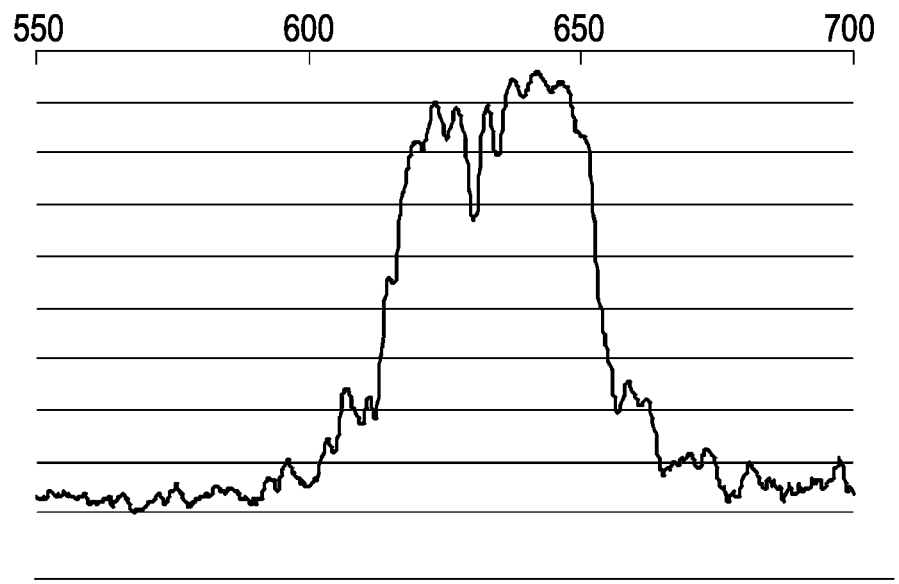
FIG. 8A is a graph showing the width of a red diffraction wavelength band obtained through a photosensitive material layer which diffracts and reflects a red light beam according to the first embodiment.

The changes in the values of the reproduction center wavelengths, the changes being observed before and after the laminated structure is heated, are as shown in Table 1. Further, as shown in FIG. 8A, the width of a red diffractive wavelength band of which center is 635 nm is increased to 38 nm. Here, before the laminated structure is heated, the width of the red diffractive wavelength band of which center is 596 nm is 11 nm.

Thus, according to the hologram recording film manufacturing method of the first embodiment, the laminated structure is irradiated with an energy ray from the laminated structure's one face side, and heated. Consequently, the slant angles of the M first photosensitive material layers become different from each other while the value A of the surface pitch is retained. Namely, the values of the pitches defined on the surfaces of the M first photosensitive material layers are the same as each other, and the slant angles observed on the surfaces of the M first photosensitive material layers are different from each other. Therefore, the number of the steps of manufacturing the hologram recording film is not increased and the productivity is high. Further, the manufacturing method reduces undesired interference fringes formed on the hologram recording film, which had occurred according to related arts. Still further, the manufacturing method reduces the mixing of air bubbles or the like into the hologram recording film during the manufacturing procedures. Further, since the manufacturing method allows for easily manufacturing a multilayer laminated structure, the diffractive wavelength band of the diffraction grating layer can further be increased and the brightness of an image generated through the image display apparatus can be increased with facility.

Second Embodiment

A second embodiment is a modulation of the first embodiment. In the second embodiment, the equation M=3 holds. The first photosensitive material precursor layers 11A, 11B, and 11C, and the second photosensitive material precursor layers 12A and 12B that are used in the second embodiment are the same as the first photosensitive material precursor layers 11A and 11B, and the second photosensitive material precursor layer 12A that are used in the first embodiment. However, the conditions for irradiating the laminated structure with the reference laser light beam and the object laser light beam are slightly different from those of the first embodiment.

The values of the surface pitches, the slant angles, and the reproduction center wavelengths (λ) of the first first photosensitive material layer 31A, the second first photosensitive material layer 31B, the third first photosensitive material layer 31C, the first second photosensitive material layer 32A, and the second second photosensitive material layer 32B that are obtained are exemplarily shown in Table 3 that follows.

TABLE 3

|  | Surface Pitch | Slant Angle | Reproduction Center Wavelength (λ) |
|---|---|---|---|
| First first photosensitive material layer | 0.4 μm | 30.3°/28.8° | 607 nm/585 nm |
| First second photosensitive material layer | 0.3 μm | 31.2°/29.3° | 445 nm/425 nm |
| Second first photosensitive material layer | 0.4 μm | 31.5°/28.8° | 625 nm/585 nm |
| Second second photosensitive material layer | 0.3 μm | 32.7°/29.3° | 460 nm/425 nm |
| Third first photosensitive material layer | 0.4 μm | 32.4°/28.8° | 638 nm/585 nm |

Figure 2B:
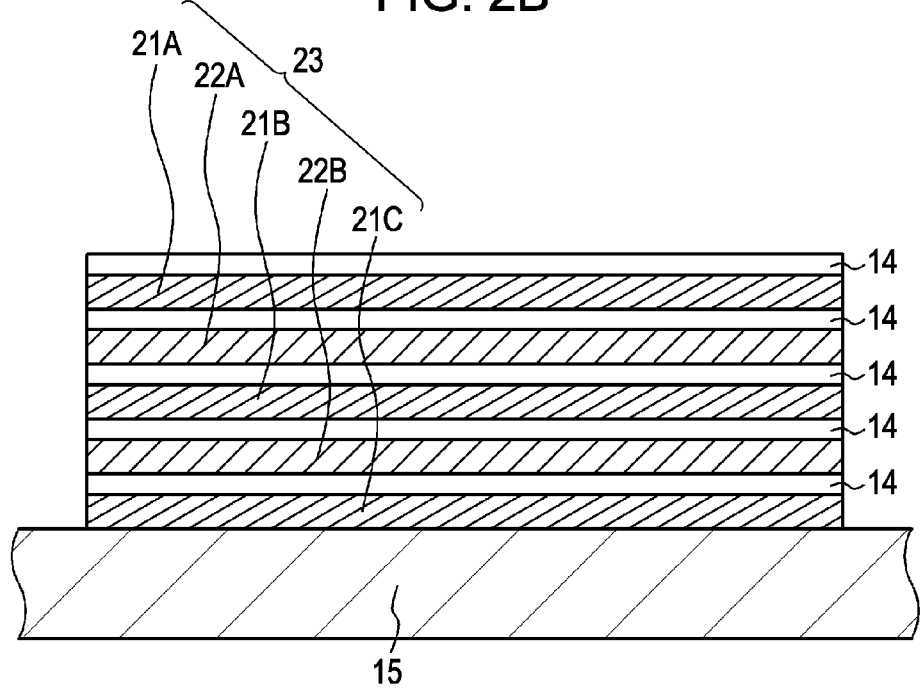
FIG. 2B is a schematic sectional view of a laminated structure or the like, which illustrates the hologram recording film manufacturing method according to the second embodiment.
Figure 3:
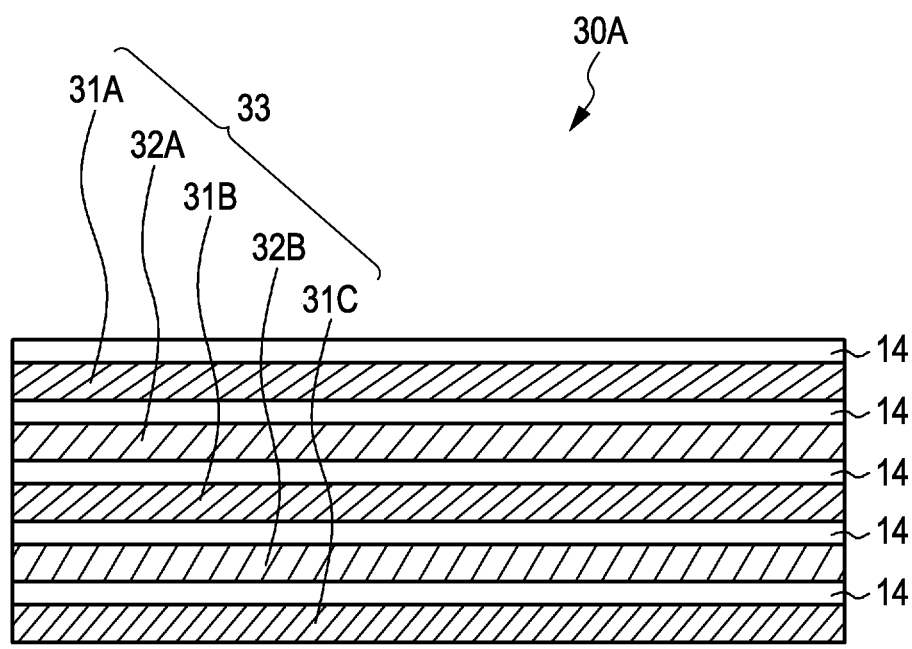
FIG. 3 is the sequel of FIG. 2B, that is, a schematic sectional view of a laminated structure or the like, which illustrates the hologram recording film manufacturing method according to the second embodiment.

Schematic sectional views of laminated structures or the like obtained through the steps of manufacturing a hologram recording film 30A of the second embodiment are shown in FIGS. 2A, 2B, and 3. The schematic sectional view of FIG. 2A shows the laminated structure or the like obtained through a step identical to [Step-100] shown in FIG. 1A of the first embodiment. The schematic sectional view of FIG. 2B shows the laminated structure or the like obtained through a step identical to [Step-110] shown in FIG. 1B of the first embodiment. The schematic sectional view of FIG. 3 shows the laminated structure or the like obtained through a step identical to [Step-120] shown in FIG. 1C of the first embodiment. The reference numerals 21A, 21B, and 21C denote the first photosensitive material layers obtained after the interference fringes are formed and before being irradiated with energy rays. The reference numerals 22A and 22B denote the second photosensitive material layers obtained after the interference fringes are formed and before being irradiated with energy rays.

In the second embodiment, the surface pitches of the M−1 second photosensitive material layers 32A and 32B are the same as each other while the slant angles of the M−1 second photosensitive material layers 32A and 32B are different from each other. The reproduction center wavelength of each of the M−1 second photosensitive material layers 32A and 32B approaches the long-wavelength side as the value of M is increased. Namely, the difference between the reproduction center wavelength obtained before the energy ray irradiation is performed and that obtained after the energy ray irradiation is performed is increased as the energy ray irradiation amount is decreased.

Figure 8B:
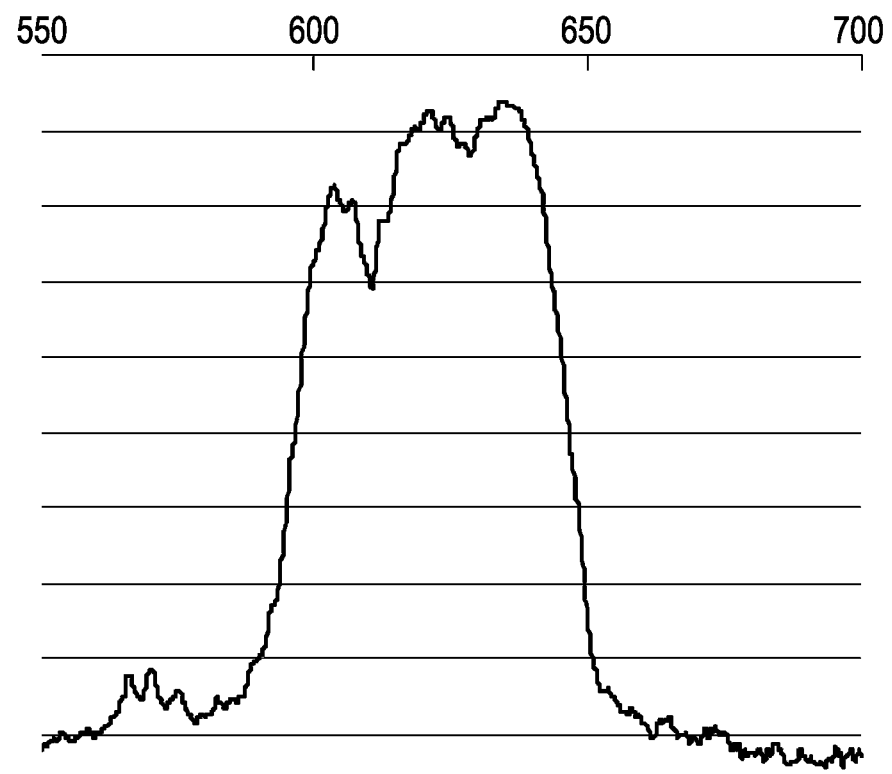
FIG. 8B is a graph showing the width of the red diffraction wavelength band obtained through the photosensitive material layer which diffracts and reflects a red light beam according to the second embodiment.

The changes in the values of the reproduction center wavelengths, the changes being observed before and after the laminated structure is heated, are as shown in Table 3. Further, as shown in FIG. 8B, the width of a red diffractive wavelength band of which center is 630 nm is increased to 51 nm. Here, before the laminated structure is heated, the width of a red diffractive wavelength band of which center is 585 nm is 12 nm. Further, though not shown, the width of a blue diffractive wavelength band of which center is 453 nm is increased to 35 nm. Before the laminated structure is heated, the width of a blue diffractive wavelength band of which center is 425 nm is 8 nm.

The ultraviolet irradiation amount is determined to be 48 Joules. When the ultraviolet ray passes through the photosensitive material layers, about 50 percent of the energy of the ultraviolet ray is absorbed by the photosensitive material layers. Consequently, the amounts of ultraviolet with which the photosensitive material layers are irradiated are as shown in Table 4 that follows. Further, the laminated structure is heated to 100° C. for eighty minutes through an oven.

TABLE 4

|  | Ultraviolet irradiation amount (Joule) |
|---|---|
| First first photosensitive material layer 21A | 48 |
| First second photosensitive material layer 22A | 24 |
| Second first photosensitive material layer 21B | 12 |
| Second second photosensitive material layer 22B | 6 |
| Third first photosensitive material layer 21C | 3 |

Third Embodiment

A third embodiment, which is another modulation of the first embodiment, relates to the second configuration manufacturing method and a second configuration hologram recording film 30B. In the third embodiment, each of resin layers 16A and 16B includes a film absorbing part of an energy ray. Specifically, each of the resin layers 16A and 16B includes a film including an acrylic-based resin having a thickness of 5 μm. The above-described film absorbs 15 percent of an ultraviolet ray having a wavelength of 365 nm. The index of the ultraviolet absorption is calculated by measuring the ultraviolet intensity corresponding to the wavelength of 365 nm observed prior to and subsequent to the ultraviolet transmission through the use of Light Power meter Model C6080-03 manufactured by Hamamatsu Photonics K.K. In the third embodiment, the equation M=3 holds. The first photosensitive material precursor layers 11A, 11B, and 11C that are used in the third embodiment are the same as the first photosensitive material precursor layers 11A and 11B that are used in the first embodiment. However, the conditions for irradiating the laminated structure with the reference laser light beam and the object laser light beam are slightly different from those of the first embodiment.

According to a manufacturing method of the third embodiment, the laminated structure is irradiated with an energy ray from the laminated structure's first first photosensitive material layer side at the above-described step (C).

The values of the surface pitches, the slant angles, and the reproduction center wavelengths (λ) of the first first photosensitive material layer 31A, the second first photosensitive material layer 31B, and the third first photosensitive material layer 31C that are obtained are exemplarily shown in Table 5 that follows.

TABLE 5

|  | Surface Pitch | Slant Angle | Reproduction Center Wavelength (λ) |
|---|---|---|---|
| First first photosensitive material layer | 0.4 μm | 30.3°/29.3° | 607 nm/592 nm |
| Second first photosensitive material layer | 0.4 μm | 31.2°/29.3° | 621 nm/592 nm |
| Third first photosensitive material layer | 0.4 μm | 32.6°/29.3° | 640 nm/592 nm |

Figure 4A:
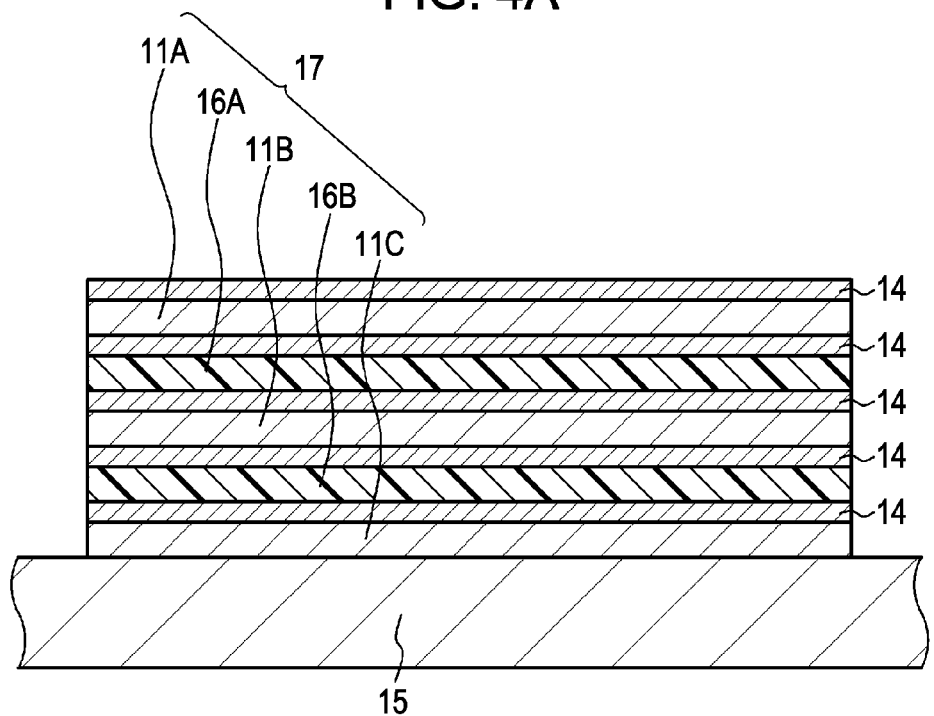
FIG. 4A is a schematic sectional view of a laminated structure or the like, which illustrates a hologram recording film manufacturing method according to a third embodiment.
Figure 4B:
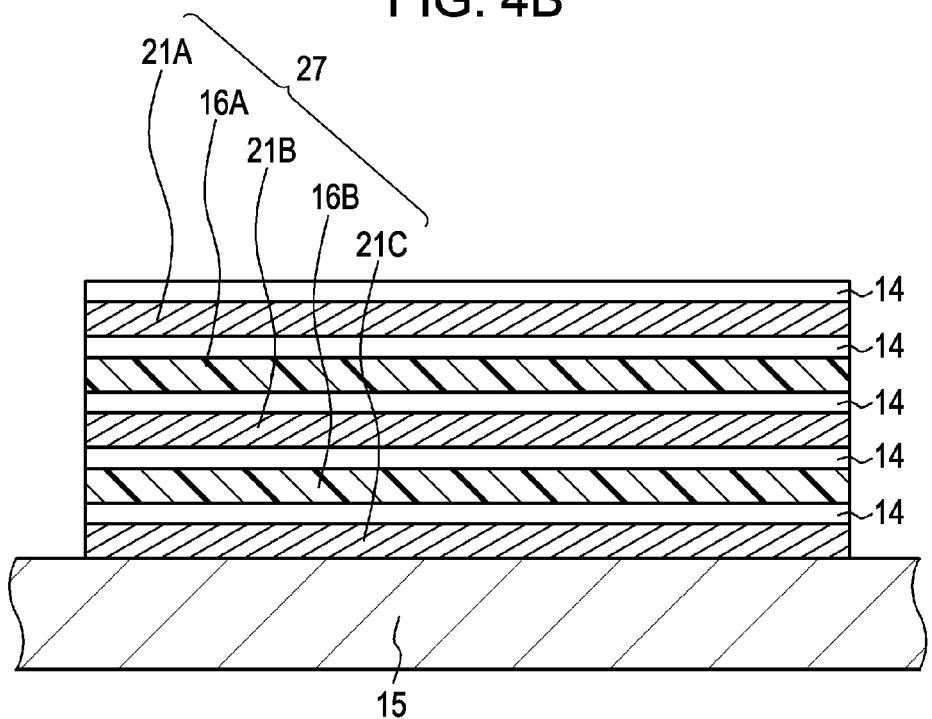
FIG. 4B is a schematic sectional view of a laminated structure or the like, which illustrates the hologram recording film manufacturing method according to the third embodiment.
Figure 5:
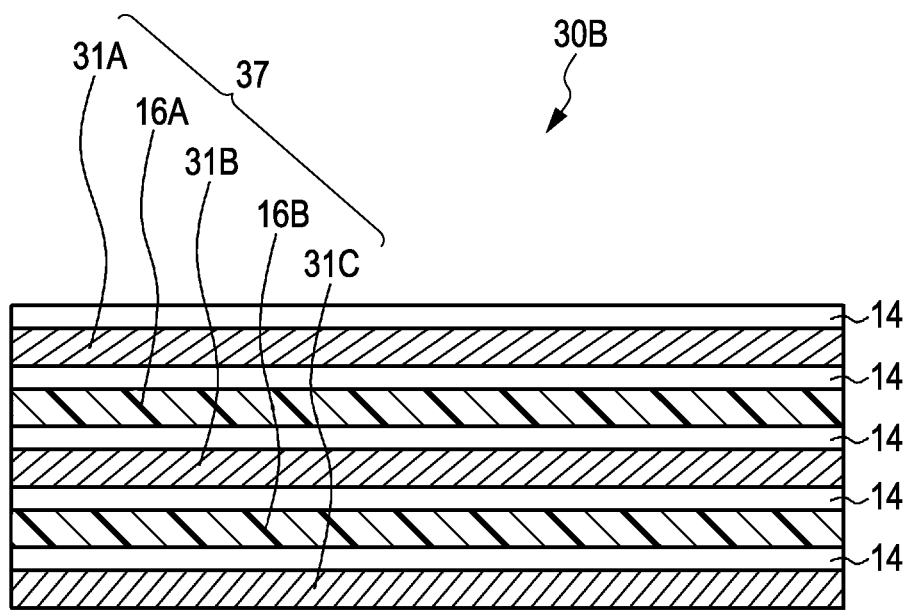
FIG. 5 is the sequel of FIG. 4B, that is, a schematic sectional view of a laminated structure or the like, which illustrates the hologram recording film manufacturing method according to the third embodiment.

Schematic sectional views of laminated structures or the like obtained through the steps of manufacturing the hologram recording film 30B of the third embodiment are shown in FIGS. 4A, 4B, and 5. The schematic sectional view of FIG. 4A shows the laminated structure or the like obtained through a step identical to [Step-100] shown in FIG. 1A described in the first embodiment. The schematic sectional view of FIG. 4B shows the laminated structure or the like obtained through a step identical to [Step-110] shown in FIG. 1B described in the first embodiment. The schematic sectional view of FIG. 5 shows the laminated structure or the like obtained through a step identical to [Step-120] shown in FIG. 1C described in the first embodiment. The reference numerals 21A, 21B, and 21C denote the first photosensitive material layers obtained after the interference fringes are formed and before being irradiated with energy rays.

The changes in the values of the reproduction center wavelengths, the changes being observed before and after the laminated structure is heated, are as shown in Table 5. The width of a diffractive wavelength band of which center is 622 nm is increased to 52 nm. Before the laminated structure is heated, the width of a diffractive wavelength band of which center is 592 nm is 10 nm.

The ultraviolet irradiation amount is determined to be 58 Joules. When the ultraviolet ray passes through the photosensitive material layers, about 50 percent of the energy of the ultraviolet ray is absorbed by the photosensitive material layers, and about 15 percent of the energy of the ultraviolet ray is absorbed by the resin layers. Consequently, the amounts of ultraviolet with which the photosensitive material layers are irradiated are as shown in Table 6 that follows. After that, the laminated structure is heated to 100° C. for eighty minutes through an oven.

TABLE 6

|  | Ultraviolet irradiation amount (Joule) |
|---|---|
| First first photosensitive material layer 31A | 58 |
| Second first photosensitive material layer 31B | 24.7 |
| Third first photosensitive material layer 31C | 10.5 |

Fourth Embodiment

A fourth embodiment relates to the hologram recording film manufacturing method according to the second mode in an embodiment.

The hologram recording film manufacturing method includes:

(A) obtaining at least one photosensitive material layer on which at least two interference fringes with a desired pitch (surface pitch) and a desired slant angle are formed from a first photosensitive material precursor layer including a photosensitive material by irradiating the first photosensitive material precursor layer with a reference laser light beam and an object laser light beam; and (B) irradiating regions of the photosensitive material layer with energy rays with different energy amounts, and heating the photosensitive material layer so as to make slant angles of the regions of the photosensitive material layer (diffraction grating layer) different from each other while retaining the value Λ of the pitch (surface pitch) defined on the surface of the photosensitive material layer.

Step (A) may be substantially equal to [Step-110] described in the first embodiment, and step (B) may be substantially equal to [Step-120] described in the first embodiment except that the regions of the photosensitive material layer are irradiated with energy rays with different energy amounts. For irradiating the regions of the photosensitive material layer with the energy rays with the different energy amounts, the integrals of the amounts of energy with which the regions of the photosensitive material layer are irradiated may be made different from each other and/or the energy ray irradiation amount per unit area may be varied among the regions. The energy amount may be changed seamlessly and/or in stages based on appropriate specifications of the image display apparatus.

In the fourth embodiment, the reproduction center wavelength observed in the obtained photosensitive material layer (diffraction grating layer) is varied among the regions of the photosensitive material layer (diffraction grating layer. The reproduction center wavelength approaches the long-wavelength side as the amount of the energy ray irradiation is decreased. Namely, the difference between the reproduction center wavelength obtained before the energy ray irradiation is performed and that obtained after the energy ray irradiation is performed is increased as the energy ray irradiation amount is decreased. Thus, according to the hologram recording film of the fourth embodiment, the regions of the photosensitive material layer are irradiated with energy rays with different energy amounts, and the photosensitive material layer is heated so that slant angles of the regions of the photosensitive material layer (diffraction grating layer) are made different from each other while retaining the value Λ of the surface pitch. Consequently, the number of the steps is not increased and the productivity is high. The hologram recording film obtained through the fourth embodiment can be used for the first diffraction grating member and/or the second diffraction grating member used in the optical device disclosed in Japanese Unexamined Patent Application Publication No. 2007-094175, for example.

Fifth Embodiment

Figures 10A, 10B:
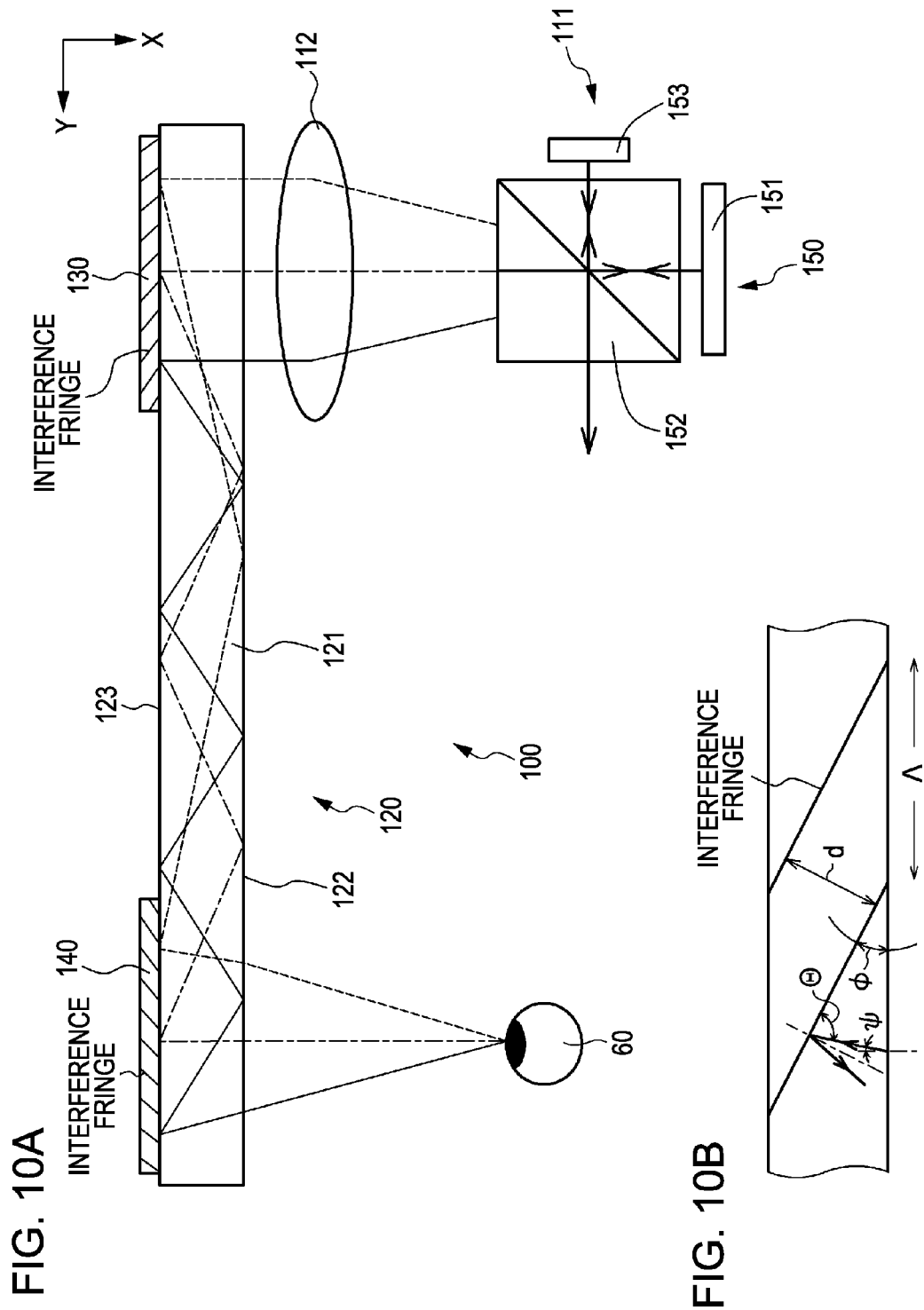
FIG. 10 is a conceptual illustration of an image display apparatus according to a fifth embodiment.

A fifth embodiment relates to an image display apparatus 100 according to a first mode in an embodiment. As shown in a conceptual illustration of FIG. 10A, the image display apparatus 100 includes:

(A) an image forming device 111 including a plurality of pixels that are arranged in a two-dimensional matrix form, (B) a collimating optical system 112 configured to make a light beam emitted from each of the pixels of the image forming device 111 into a collimated light beam, and (C) an optical device 120 onto which the above-described collimated light beam is made incident, in which the collimated light beam is guided, and from which the collimated light beam is emitted.

In the first embodiment, the optical device 120 includes:

(a) a light guide plate 121 through which a light beam which is made incident on the light guide plate 121 propagates and from which the light beam is emitted, (b) a first diffraction grating member 130 provided in the light guide plate 121, the first diffraction grating member 130 being configured to diffract and reflect the light beam which is made incident on the light guide plate 121 so that the above-described light beam is totally reflected inside the light guide plate 121, and (c) a second diffraction grating member 140 provided in the light guide plate 121, the second diffraction grating member 130 being configured to diffract and reflect the light beam propagating through the light guide plate 121 through the total reflection and emit the above-described light beam from the light guide plate 121, wherein each of the first and second diffraction grating members 130 and 140 includes the hologram recording film described in any one of the first to third embodiments and a reflection-type volume hologram diffraction grating. Here, the term "reflection-type volume hologram diffraction grating" denotes a hologram diffraction grating configured to diffract and reflect a plus primary diffraction light beam alone.

Namely, the hologram recording film includes the laminated structure having the M (where the expression M≥2 holds) first photosensitive material layers and the M−1 resin layer that are alternately laminated on one another, where interference fringes having desired surface pitches and slant angles are formed on the M first photosensitive material layers including the photosensitive material. The surface pitches of the M first photosensitive material layers are identical to each other, and the slant angles of the M first photosensitive material layers are different from each other.

The first diffraction grating member 130 is provided (adhered) onto a second face 123 of the light guide plate 121, and diffracts and reflects the above-described collimated light beam which is made incident from a first face 122 of the light guide plate 121 onto the light guide plate 121 so that the collimated light beam is totally reflected inside the light guide plate 121. Further, the second diffraction grating member 140 is provided (adhered) onto the second face 123, diffracts and reflects the collimated light beam propagating through the light guide plate 121 through the total reflection a plurality of times, and emits the collimated light beam, as it is, from the first face 122 of the light guide plate 121. However, without being limited to the above-described configuration, the second face 123 may be the incident face of the light guide plate, and the first face 122 may be the emission face of the light guide plate. Further, the diffraction grating member may be provided on (adhered to) the light guide plate so that the first first photosensitive material layer of the hologram recording film faces the second face 123 of the light guide plate 121. Otherwise, the diffraction grating member may be provided on (adhered to) the light guide plate so that the M-th first photosensitive material layer of the hologram recording film faces the second face 123 of the light guide plate 121.

In the fifth embodiment, each of the first and second diffraction grating members 130 and 140 includes P (where the equation P=3 holds and the number 3 denotes three types of colors including red, green, and blue) photosensitive material layers that are laminated on one another, so as to be ready for the diffraction and reflection of P types of light beams having P types of wavelength bands (and/or wavelengths). The interference fringes corresponding to a single type of wavelength band (and/or wavelength) are formed on each of the photosensitive material layers including a photopolymer material, and the photosensitive material layers are generated according to the methods described in the first to third embodiments. The surface pitch of the interference fringes formed on each of the P types of photosensitive material layers is constant in each of the wavelength bands, and the interference fringes are linear and parallel with the Z-axis direction. In each of FIGS. 10A and 12, each of the first and second diffraction grating members 130 and 140 is shown as a single layer. Through the use of the above-described configuration, it becomes possible to increase the diffraction efficiency and the diffraction reception angle, and optimize the diffraction angle when the light beams with the individual wavelength bands (and/or wavelengths) are diffracted and reflected in the first and second diffraction grating members 130 and 140.

Namely, the collimated light beams of the three colors including red, green, and blue propagate through the light guide plate 121 through the total reflection and are emitted. Since the light guide plate 121 is thin and the optical path inside the light guide plate 121, through which the collimated light beams propagate, is long, the number of the total reflections attained until the collimated light beams reaches the second diffraction grating member 140 is varied based on each angle of view. More specifically, of the collimated light beams that are made incident on the light guide plate 121, the reflection number of a collimated light beam which is made incident at an angle taking a direction toward the second diffraction grating member 140 is smaller than that of a collimated light beam which is made incident at an angle taking a direction away from the second diffraction grating member 140. This is because the angle which a collimated light beam that is diffracted and reflected in the first diffraction grating member 130 and that is made incident on the light guide plate 121 at an angle taking a direction toward the second diffraction grating member 140 forms with a normal of the light guide plate 121 when the collimated light beam propagating through the light guide plate 121 collides with the inside surface of the light guide plate 121 is smaller than the angle which a collimated light beam which is made incident on the light guide plate 121 at an angle reverse to the above-described angle, that is, an angle away from the second diffraction grating member 140, forms with the normal of the light guide plate 121. The form of the interference fringes generated inside the second diffraction grating member 140 and that of the interference fringes generated inside the first diffraction grating member 130 are symmetric with respect to a virtual face perpendicular to the axis of the light guide plate 121.

In the first embodiment, the image forming device 111 includes a reflection-type spatial light modulation device 150 and a light source 153 including a light-emitting diode emitting a white color beam. More specifically, the reflection-type spatial light modulation device 150 includes a liquid crystal display (LCD) 151 including the LCOS functioning as the light valve and a polarization beam splitter 152 that reflects part of the light beam emitted from the light source 153, leads the reflected light beam to the LCD 151, makes part of the light beam reflected by the LCD 151 pass through, and leads the light beam to the collimating optical system 112. The LCD 151 includes a plurality of (e.g., 320×240) pixels (liquid crystal cells) that are arranged in a two-dimensional matrix form. The polarization beam splitter 152 has a configuration and a structure according to a related art. A non-polarized light beam emitted from the light source 153 collides with the polarization beam splitter 152. A P-polarized component passes through the polarization beam splitter 152 and emitted from the system. On the other hand, an S-polarized component is reflected in the polarization beam splitter 152, made incident on the LCD 151, reflected inside the LCD 151, and emitted from the LCD 151. Of the light beams emitted from the LCD 151, a light beam emitted from a pixel displaying "white" includes many P-polarized components, and a light beam emitted from a pixel displaying "black" includes many S-polarized components. Therefore, of the light beams that are emitted from the LCD 151 and that collide with the polarization beam splitter 152, the P-polarized component passes through the polarization beam splitter 152 and is led to the collimating optical system 112. On the other hand, the S-polarized component is reflected in the polarization beam splitter 152 and returned to the light source 153. The LCD 151 includes a plurality of (e.g., 320×240) pixels (the number of liquid crystal cells is three times larger than the pixel number) that are arranged in a two-dimensional matrix form, for example. The collimating optical system 112 includes, for example, a convex lens, and the image forming device 111 (more specifically, the LCD 151) is arranged at the place (position) of a focal length defined in the collimating optical system 112 so as to generate a collimated light beam. Here, a single pixel includes a red light emitting sub-pixel emitting a red light beam, a green light emitting sub-pixel emitting a green light beam, and a blue light emitting sub-pixel emitting a blue light beam.

In the fifth embodiment and/or a sixth embodiment, which will be described later, the light guide plate 121 including optical glass and/or a plastic material has two parallel faces (the first and second faces 122 and 123) extending in parallel with the axis of the light guide plate 121. The first face 122 and the second face 123 are opposed to each other. The collimated light beam is made incident on the first face 122 corresponding to the light incident face, propagates through the light guide plate 121 through the total reflection, and is emitted from the second face 123 corresponding to the light emission face. Without being limited to the above-described configuration, the second face 123 may be provided as the light incident face and the first face 122 may be provided as the light emission face.

Figure 11:
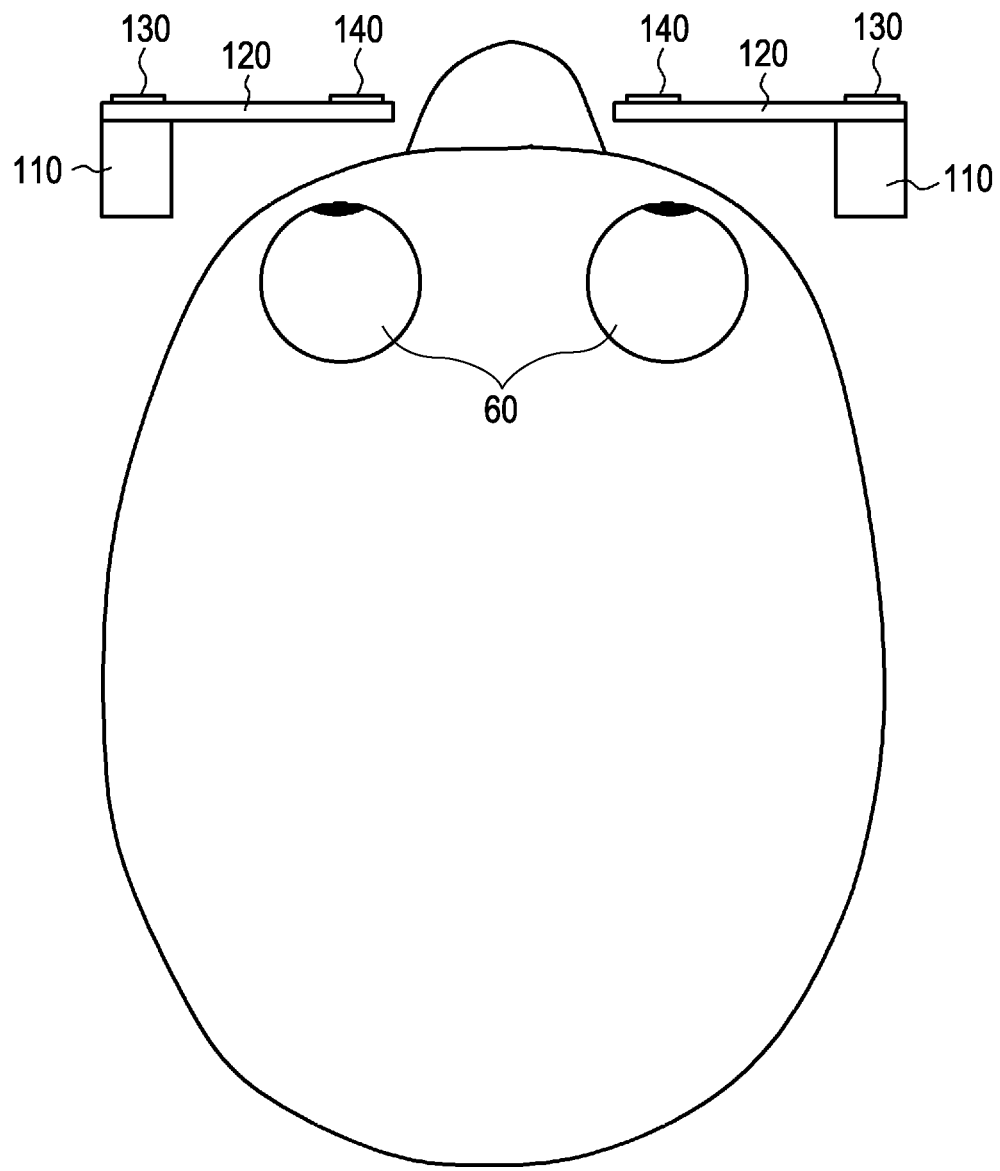
FIG. 11 is a conceptual illustration showing the state where a pair of the image display apparatuses of the fifth embodiment is worn by an observer.

FIG. 11 is a conceptual illustration showing the state where a pair of the image display apparatuses of the fifth embodiment is worn by a user, as the HMD. The use of the image display apparatuses according to the fifth embodiment allows for reducing the weight and the size of the HMD, significantly reducing user discomfort caused by the HMD mounted on the user's head, and reducing the manufacturing cost.

Sixth Embodiment

Figure 12:
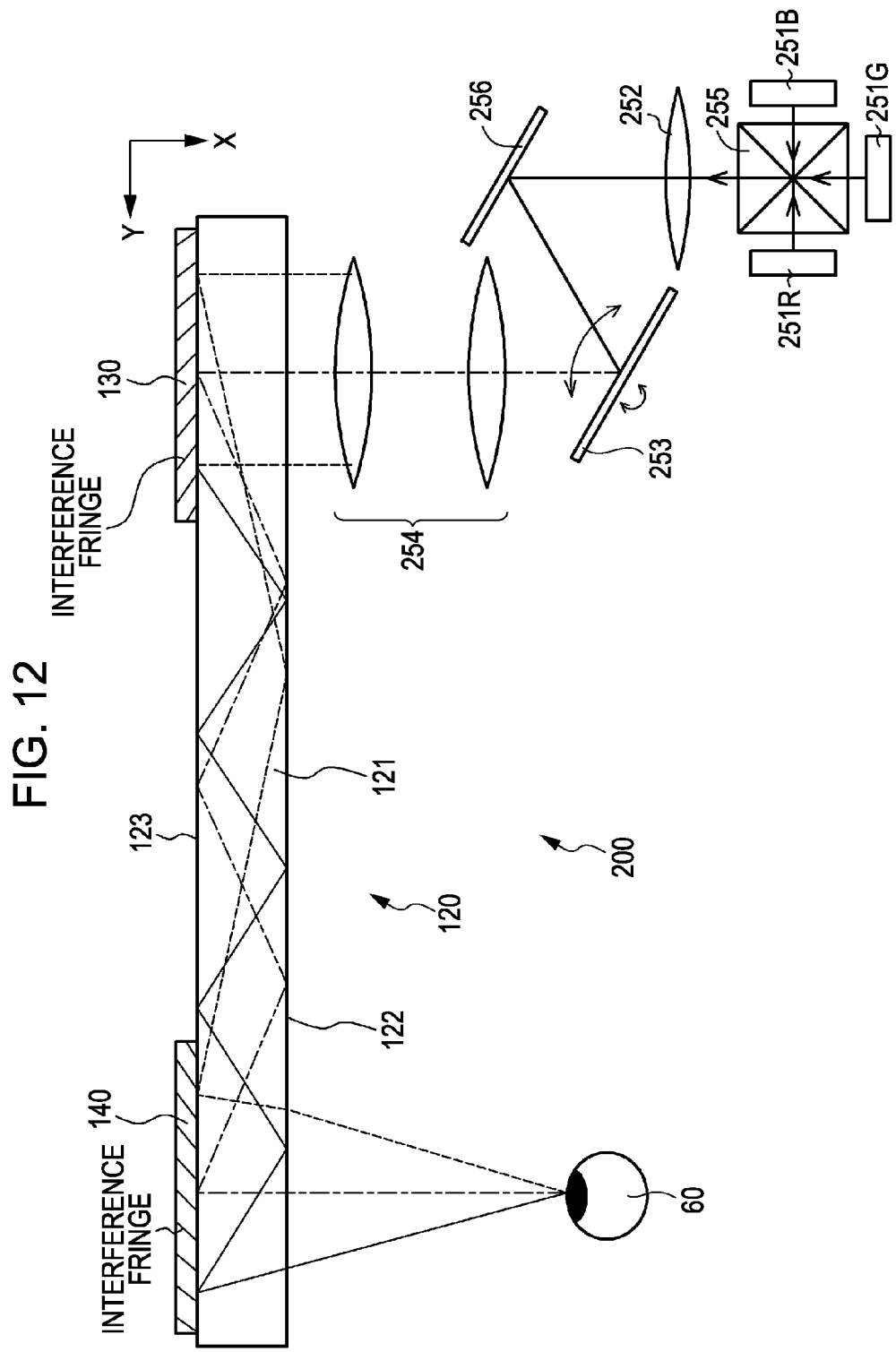
FIG. 12 is a conceptual illustration of an image display apparatus according to a sixth embodiment.

The sixth embodiment in an embodiment relates to an image display apparatus 200 according to the second mode. The image display apparatus 200 includes:

(A) a light source 251, (B) a collimating optical system 252 making a light beam emitted form the light source 251 into a collimated light beam, (C) a scanning unit 253 configured to scan the collimated light beam emitted from collimating optical system 252, (D) a relay optical system 254 configured to relay the collimated light beam scanned through the scanning unit 253, and (E) an optical device 120 onto which the above-described collimated light beam is made incident, in which the collimated light beam is guided, and from which the collimated light beam is emitted through the relay optical system 254, as shown in a conceptual illustration of FIG. 12. Since the optical device 120 has the same configuration and structure as those of the optical device 120 described in the fifth embodiment, the detailed description thereof will be omitted.

The light source 251 includes a red light emitting element 251R emitting a red light beam, a green light emitting element 251G emitting a green light beam, and a blue light emitting element 251B emitting a blue light beam, and each of the light emitting elements includes a semiconductor laser element. The light beams of three primary colors, which are emitted from the light source 251, pass through a cross prism 255 so that the color synthesis is achieved, the optical paths of the light beams are assembled into a single optical path, and the light beams are made incident on the collimating optical system 252 having a positive optical power on the whole and emitted from the collimating optical system 252 as a collimated light beam. The above-described collimated light beam is reflected by a total reflection mirror 256, and subjected to horizontal scanning and vertical scanning through the scanning unit 253 that includes the MEMS including a micromirror which can be freely rotated in a two-dimensional direction and that can scan the incident collimated light beam two-dimensionally. Consequently, the collimated light beam is made into a type of two-dimensional image and at least one virtual pixel is generated. Then, a light beam emitted from the virtual pixel passes through the relay optical system 254 including a relay optical system according to a related art, and is made into a collimated light beam. The collimated light beam is made incident on the optical device 120.

Thus, the present application has been explained based on the above-described embodiments. However, the present invention can be achieved without being limited to the above-described embodiments. The configuration and structure of each of the hologram recording films, the laminated structures, and the image display apparatuses according to the above-described embodiments are exemplarily described. The configuration and structure can, therefor, be modified appropriately. For example, the optical device described in the fifth embodiment and/or the sixth embodiment may include a first polarization unit having a transmission-type hologram, which is provided on the first face 122 of the light guide plate 121, in place of the first diffraction grating member 130, and the second diffraction grating member 140 having a reflection-type hologram, which is provided on the second face 122. According to the above-described configuration, a light beam which is made incident on the first polarization unit is diffracted, satisfies the total reflection condition inside the light guide plate 121, and propagates to the second diffraction grating member 140. Then, the light beam is diffracted and reflected by the second diffraction grating member 140, and emitted from the light guide plate 121. Otherwise, a first polarization unit functioning as a reflecting mirror may be provided in the light guide plate 121 in place of the first diffraction grating member. The above-described first polarization unit may include, for example, a light reflection film (a type of mirror) that has a metal including an alloy and that reflects a light beam which is made incident on the light guide plate 121 and/or a diffraction grating (e.g., a hologram diffraction grating film) configured to diffract the light beam which is made incident on the light guide plate 121. Otherwise, a second polarization unit functioning as a semitransparent mirror may be provided in the light guide plate 121 in place of the second diffraction grating member. The above-described second polarization unit may include, for example, a multilayer laminated structure including a large number of dielectric lamination films that are laminated on one another, a half mirror, a polarization beam splitter, and a hologram diffraction grating film. Otherwise, the first polarization unit including the transmission-type hologram may be replaced with a combination of a transmission-type LCD and a free form surface lens.

Further, the hologram recording film manufacturing method according to the second mode can be used in place of the hologram recording film manufacturing method according to the first mode. Namely, when the laminated structure is irradiated with an energy ray from the laminated structure's one face side at step (C), the regions of the laminated structure may be irradiated with energy rays with different energy amounts so as to make the slant angles observed in the regions of the laminated structure different from each other while retaining the value Λ of the surface pitch. Further, the laminated structure may include not only the first and second photosensitive material precursor layers, but also the first to third photosensitive material precursor layers, or the first to fourth photosensitive material precursor layers.

Figure 13:
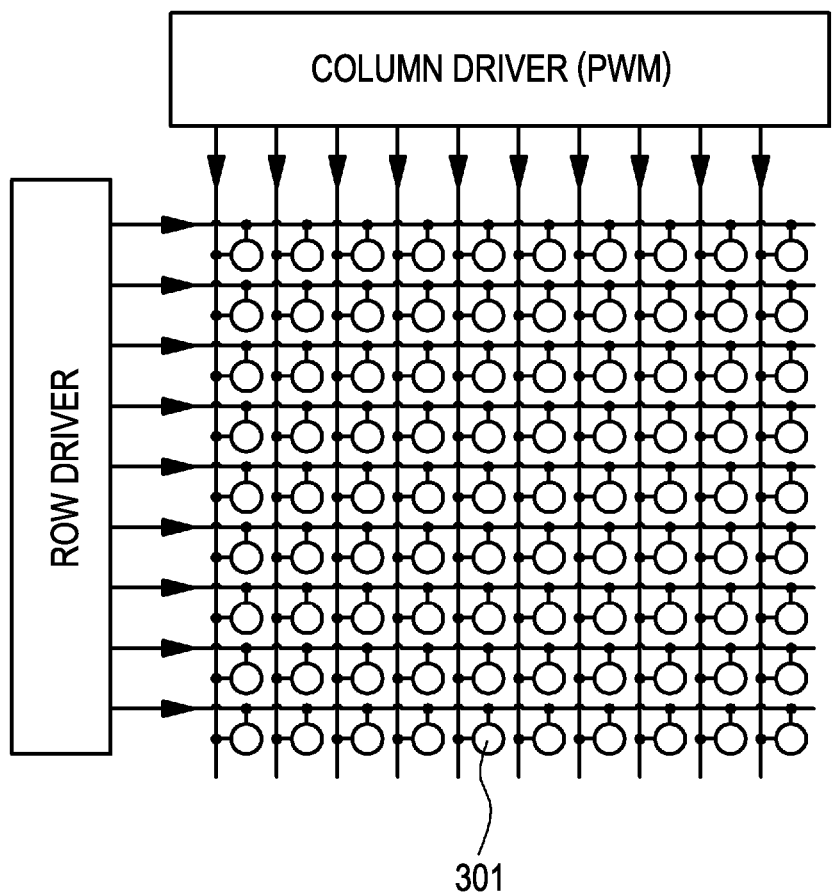
FIG. 13 is a conceptual illustration of an exemplary modulation of an image forming device that can be appropriately used in the fifth embodiment.

As an exemplary modulation of the image forming device according to the first embodiment, an active matrix-type image forming device shown in a conceptual illustration of FIG. 13 may be exemplarily provided. The active matrix-type image forming device includes a light emitting panel having light emitting elements 301, where each of the light emitting elements 301 includes a semiconductor light emitting element, that are arranged in a two-dimensional matrix form. The active matrix-type image forming device displays an image by controlling the light emission/non-light emission state of each of the light emitting elements 301 so that the light emission state of each of the light emitting elements 301 is visually identified in a direct manner. A light beam emitted from the above-described image forming device is made incident on the light guide plate 121 via the collimating optical system 112.

Figure 14:
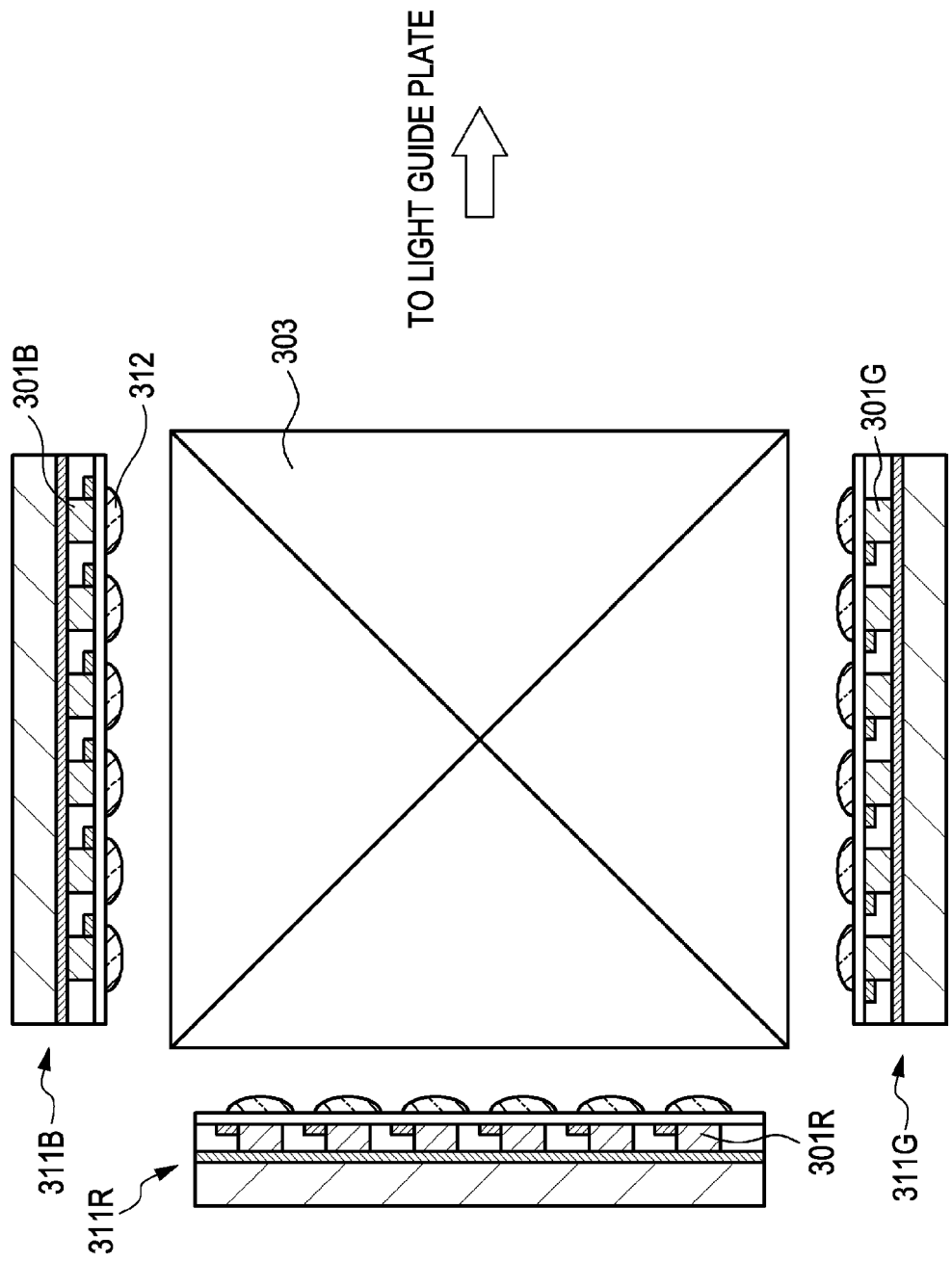
FIG. 14 is a conceptual illustration of another exemplary modulation of the image forming device that can be appropriately used in the fifth embodiment.

Otherwise, as shown in a conceptual illustration of FIG. 14, an image forming device configured to display a color image includes:

(α) a red light emitting panel 311R including red light emitting elements 301R emitting red light beams, where the red light emitting elements 301R are arranged in a two-dimensional matrix form, (β) a green light emitting panel 311G including green light emitting elements 301G emitting green light beams, where the green light emitting elements 301G are arranged in a two-dimensional matrix form, (γ) a blue light emitting panel 311B including blue light emitting elements 301B emitting blue light beams, where the blue light emitting elements 301B are arranged in a two-dimensional matrix form, and (δ) a unit provided to bring together the light beams that are emitted from the red light emitting panel 311R, the green light emitting panel 311G, and the blue light emitting panel 311B into a single optical path (e.g., a dichroic prism 303), wherein the light emission/non-light emission state of each of the red light emitting panel 311R, the green light emitting panel 311G, and the blue light emitting panel 311B is controlled. The light beams emitted from the above-described image forming device are also made incident on the light guide plate 121 via the collimating optical system 112. Here, reference numeral 312 denotes a microlens configured to collect the light beams emitted from the light emitting elements.

Figure 15:
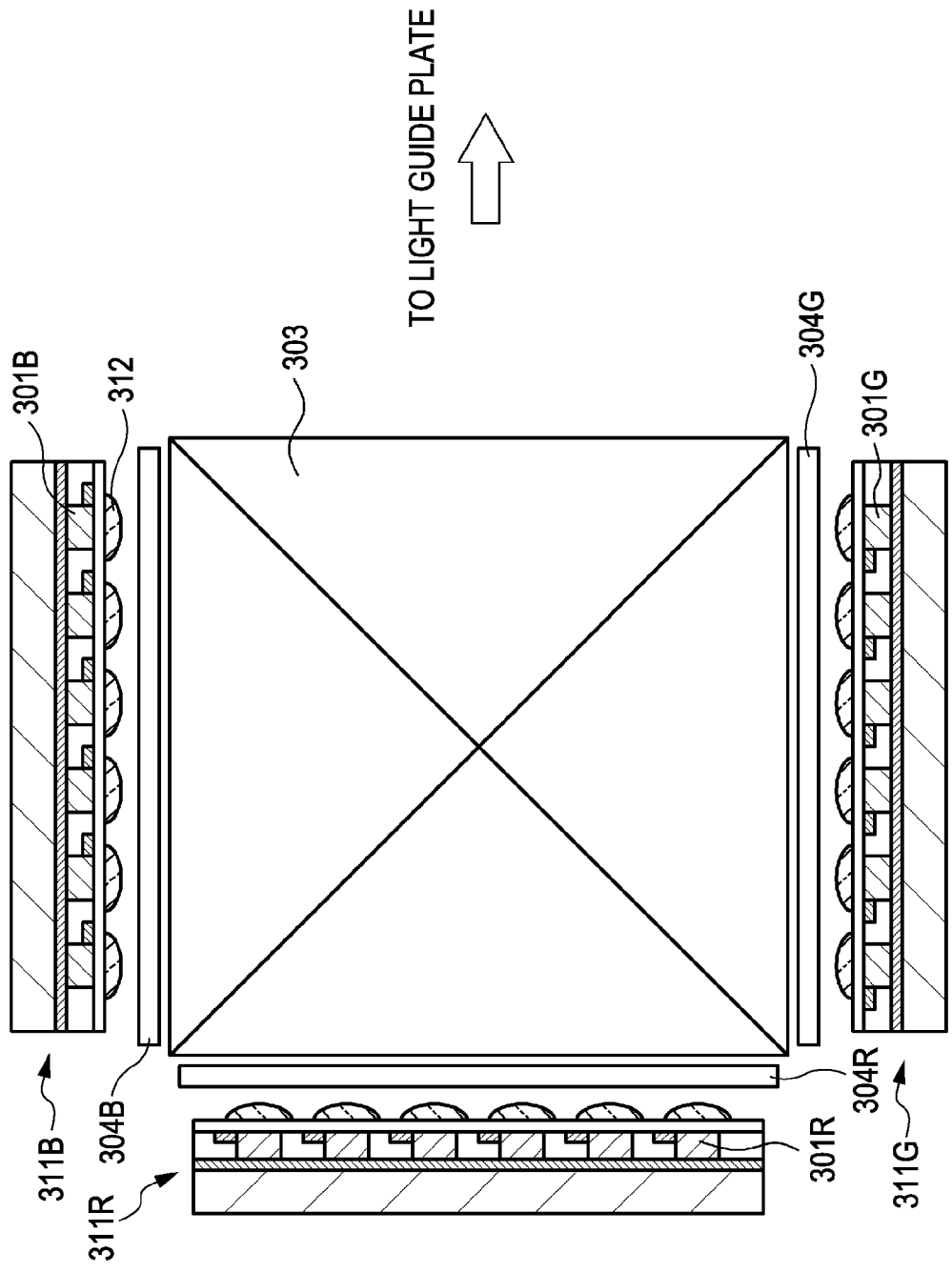
FIG. 15 is a conceptual illustration of another exemplary modulation of the image forming device that can be appropriately used in the fifth embodiment.

FIG. 15 is a conceptual illustration of an image forming device including light emitting panels 311R, 311G, 311B, and so forth in which light emitting elements 301R, 301G, and 301B are individually arranged in a two-dimensional matrix form. The passage and/or the non-passage of light beams emitted from the light emission panels 311R, 311G, and 311G is controlled through individual light passage control devices 304R, 304G, and 304B. The light beams are made incident on the dichroic prism 303 and the optical paths of the light beams are assembled into a single optical path. The light beams are made incident on the light guide plate 121 via the collimating optical system 112.

Figure 16:
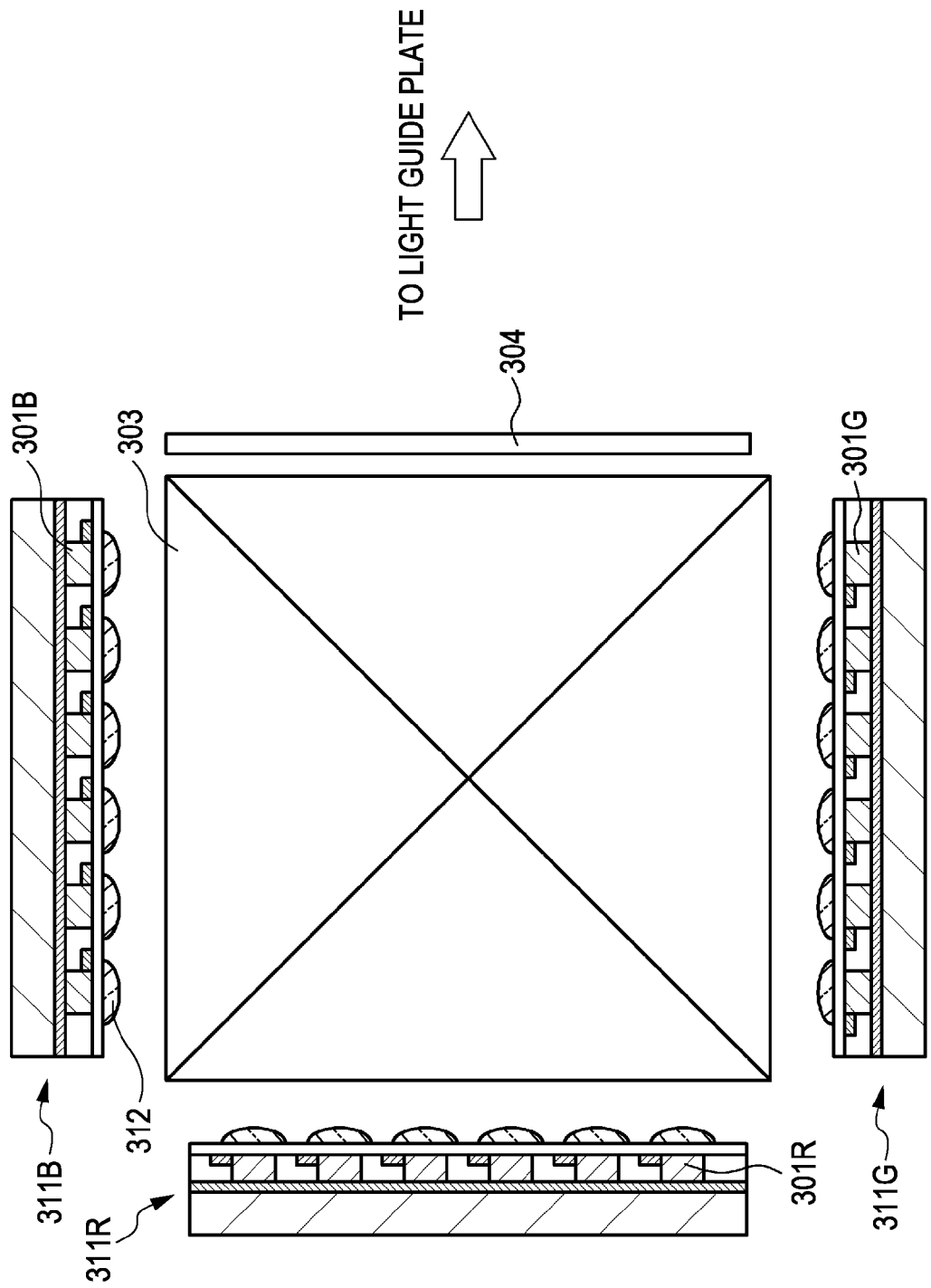
FIG. 16 is a conceptual illustration of another exemplary modulation of the image forming device that can be appropriately used in the fifth embodiment.

FIG. 16 exemplarily shows another conceptual illustration of the image forming device including the light emitting panels 311R, 311G, 311B, and so forth in which the light emitting elements 301R, 301G, and 301B are individually arranged in a two-dimensional matrix form. Light beams emitted from the light emitting panels 311R, 311G, and 311B are made incident on the dichroic prism 303 and the optical paths of the light beams are assembled into a single optical path. The passage and/or the non-passage of each of the light beams emitted from the dichroic prism 303 is controlled through the light passage control device 304, and the light beams are made incident on the light guide plate 121 via the collimating optical system 112.

Figure 17:
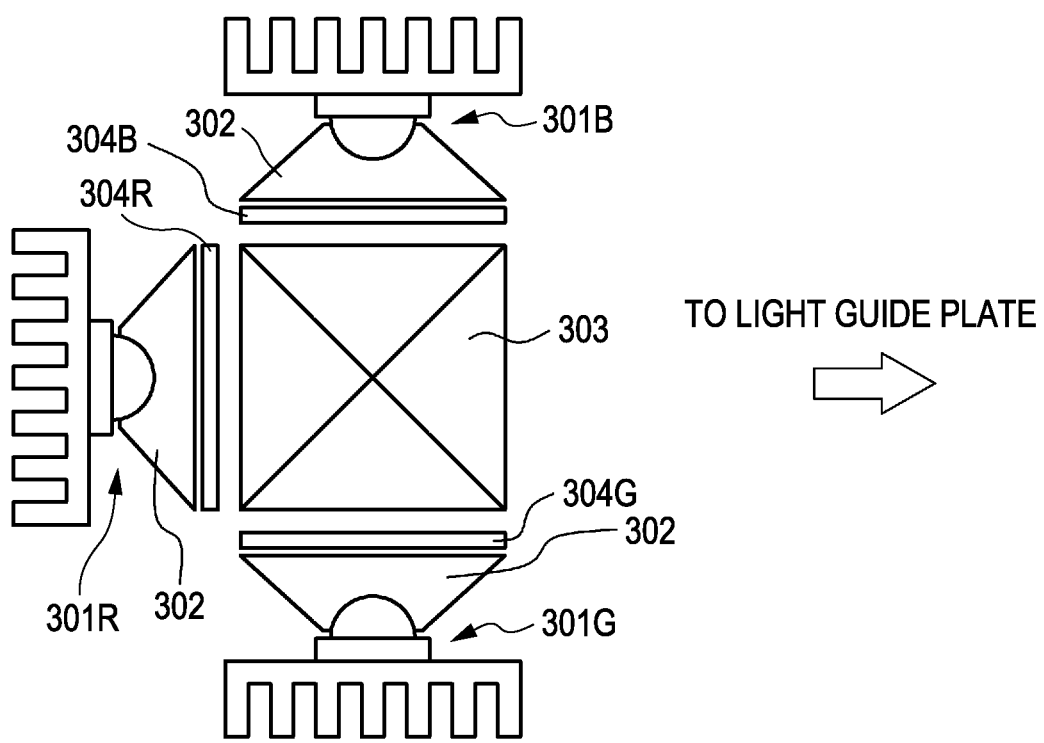
FIG. 17 is a conceptual illustration of another exemplary modulation of the image forming device that can be appropriately used in the fifth embodiment.

FIG. 17 exemplarily shows an image forming device including the light passage control device 304R (e.g., a liquid crystal display device) which is a type of light valve configured to control the red light emitting element 301R, and the passage and/or the non-passage of a light beam emitted from the red light emitting element 301R, the light passage control device 304G (e.g., a liquid crystal display device) which is a type of light valve configured to control the green light emitting element 301G, and the passage and/or the non-passage of a light beam emitted from the green light emitting element 301G, the light passage control device 304B (e.g., a liquid crystal display device) which is a type of light valve configured to control the blue light emitting element 301B, and the passage and/or the non-passage of a light beam emitted from the blue light emitting element 301B, a light guide member 302 configured to guide the light beams that are emitted from the above-described light emitting elements 301R, 301G, and 301B, where each of the above-described light emitting elements 301R, 301G, and 301B includes a gallium nitride (GaN)-based semiconductor, and a unit configured to assemble the optical paths of the light beams into a single optical path (e.g., the dichroic prism 303).

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method of manufacturing a hologram recording film, the method comprising:
    forming a laminated structure by alternately laminating M (where M≥2) first photosensitive material precursor layers including a first photosensitive material and at least one (M-1) second photosensitive material precursor layer including a second photosensitive material on one another;
    forming at least three spacer layers, a spacer layer being formed on each of the first and second photosensitive material layers;
    in a first irradiation step, irradiating the entire laminated structure at least once from one face side of the laminated structure with a reference laser light beam and an object laser light beam to form interference fringes with respective pitch and slant angles for each of the first and second photosensitive material precursor layers; and
    in a second irradiation step, irradiating the entire laminated structure from the one face side of the laminated structure in a single irradiation operation such that decreasing amounts of irradiation are absorbed by each subsequent first and second photosensitive material precursor layer; and
    heating the entire laminated structure,
    wherein a combination of the second irradiation step and the heating step thereby causes the slant angles of the M first photosensitive material precursor layers to be different for each of the M first photosensitive material precursor layers while retaining the values of the pitches formed during the first irradiation operation, the pitch being defined on a face of the first photosensitive material precursor layer.

2. The hologram recording film manufacturing method according to claim 1, wherein the energy ray used in the second irradiation step is an ultraviolet ray.

3. The hologram recording film manufacturing method according to claim 1, wherein each of the (M−1) second photosensitive material precursor layers include a different interference fringe from each of the (M) first photosensitive material precursor layers.

4. The hologram recording film manufacturing method according to claim 3, wherein photosensitive characteristics-for-the energy ray of the first photosensitive material and the second photosensitive material are different from each other.

5. The hologram recording film manufacturing method according to claim 3, wherein photosensitive characteristics-for-the reference laser light beam and the object laser light beam of each of the M first photosensitive material precursor layers and each of the (M−1) second photosensitive material precursor layers are different from each other.

6. The hologram recording film manufacturing method according to claim 1, wherein the (M−1) second photosensitive material precursor layer includes a film that absorbs a part of the energy ray.

7. The hologram recording film manufacturing method according to claim 6, wherein the (M−1) second photosensitive material precursor layer is a resin layer that has an absorbing characteristic so that the resin layer absorbs 5% or more of an ultraviolet ray having a wavelength of 400 nm or less.

* * * * *